(12) United States Patent  (10) Patent No.: US 9,267,004 B2
Okada et al.  (45) Date of Patent: Feb. 23, 2016

(54) POLYIMIDE PRECURSOR COMPOSITION AND USE THEREOF

(75) Inventors: Koji Okada, Shiga (JP); Yoshihide Sekito, Shiga (JP)

(73) Assignee: KANEKA CORPORATION, Osaka (JP)

( * ) Notice: Subject to any disclaimer, the term of this patent is extended or adjusted under 35 U.S.C. 154(b) by 126 days.

(21) Appl. No.: 12/997,151

(22) PCT Filed: Jul. 15, 2009

(86) PCT No.: PCT/JP2009/062783
§ 371 (c)(1),
(2), (4) Date: Dec. 9, 2010

(87) PCT Pub. No.: WO2010/010831
PCT Pub. Date: Jan. 28, 2010

(65) Prior Publication Data
US 2011/0083884 A1 Apr. 14, 2011

(30) Foreign Application Priority Data
Jul. 22, 2008 (JP) .................................. 2008-188426

(51) Int. Cl.
*H05K 1/03* (2006.01)
*C08G 73/10* (2006.01)
(Continued)

(52) U.S. Cl.
CPC ........ *C08G 73/1035* (2013.01); *C08G 18/0823* (2013.01); *C08G 18/10* (2013.01); *C08G 18/44* (2013.01); *C08G 73/105* (2013.01); *C08G 73/1007* (2013.01); *C08G 73/1042* (2013.01); *C08G 73/1046* (2013.01);
(Continued)

(58) Field of Classification Search
USPC ..................... 174/256, 250, 255, 258; 528/84
See application file for complete search history.

(56) References Cited

U.S. PATENT DOCUMENTS 3,926,914 A * 12/1975 Miyadera et al. ............. 528/182
5,254,659 A 10/1993 Tajima et al.
(Continued)

FOREIGN PATENT DOCUMENTS

CN 101657482 A 2/2010
JP 4-212206 A 8/1992
(Continued)

OTHER PUBLICATIONS

Japanese Patent Publication No. 2007-186663, machine translation. Inventors: Ichinose et al. Jul. 26, 2007.*
(Continued)

*Primary Examiner* — Tremesha S Willis
(74) *Attorney, Agent, or Firm* — Westerman, Hattori, Daniels & Adrian, LLP

(57) ABSTRACT

An object of the present invention is to provide (a) a polyimide precursor solution which is curable at low temperatures (not more than 200° C.) and which has excellent long-term storage stability, (b) a photosensitive resin composition, a photosensitive resin film, a thermosetting resin composition, and a polyimide insulating film, each of which is obtainable from the polyimide precursor solution and each of which is preferably usable as an insulating material for electric and electronic purposes, and (c) a printed wiring board provided with the insulating film. The above object is achievable by use of a polyimide precursor composition solution containing at least a partially imidized polyimide precursor having a urethane bond.

23 Claims, 1 Drawing Sheet

(51) Int. Cl.

| | |
|---|---|
| *C08G 18/08* | (2006.01) |
| *C08G 18/10* | (2006.01) |
| *C08G 18/44* | (2006.01) |
| *C08G 73/16* | (2006.01) |
| *C08L 79/08* | (2006.01) |
| *G03F 7/037* | (2006.01) |
| *H05K 3/28* | (2006.01) |
| *G03F 7/40* | (2006.01) |

(52) U.S. Cl.
CPC ....... *C08G 73/1067* (2013.01); *C08G 73/1071* (2013.01); *C08G 73/16* (2013.01); *C08L 79/08* (2013.01); *G03F 7/037* (2013.01); *G03F 7/40* (2013.01); *H05K 3/287* (2013.01); *H05K 1/0393* (2013.01)

(56) References Cited

U.S. PATENT DOCUMENTS

| | | | |
|---|---|---|---|
| 6,291,619 B1 * | 9/2001 | Maekawa et al. ............ 526/312 |
| 6,335,417 B1 | 1/2002 | Orikabe et al. |
| 2003/0149142 A1 * | 8/2003 | Yamanaka et al. ............ 524/86 |
| 2009/0192273 A1 | 7/2009 | Ichinose et al. |
| 2009/0240019 A1 | 9/2009 | Inoue et al. |
| 2010/0056718 A1 | 3/2010 | Murakami et al. |
| 2010/0132989 A1 | 6/2010 | Fujihara et al. |

FOREIGN PATENT DOCUMENTS

| | | |
|---|---|---|
| JP | 6-329795 A | 11/1994 |
| JP | 11-199669 A | 7/1999 |
| JP | 2001-089656 A | 4/2001 |
| JP | 2004-250584 A | 9/2004 |
| JP | 2005-029734 A | 2/2005 |
| JP | 2005-290155 A | 10/2005 |
| JP | 2005-336243 A | 12/2005 |
| JP | 2007-070529 A | 3/2007 |
| JP | 2007-186663 A | 7/2007 |
| JP | 2007-308710 A | 11/2007 |
| JP | 2008-144159 A | 6/2008 |
| JP | 2008-255249 A | 10/2008 |
| JP | 2008-308553 A | 12/2008 |
| JP | 2009-069664 A | 4/2009 |
| WO | 2008/035561 A1 | 3/2008 |

OTHER PUBLICATIONS

International Search Report of PCT/JP2009/062783, mailing date Aug. 11, 2009.

Notification of Transmittal of Translation of the International Preliminary Report on Patentability (Form PCT/IB/338) of International Application No. PCT/JP2009/062783 mailed Mar. 17, 2011 with Forms PCT/IB/373 and PCT/ISA/237.

* cited by examiner

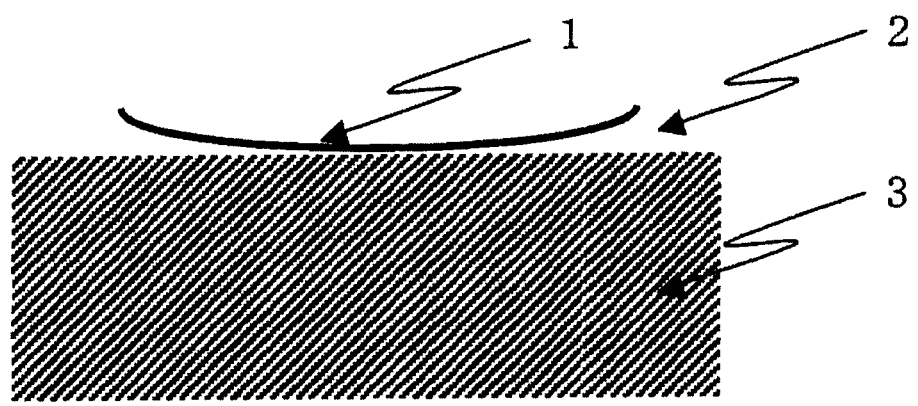

POLYIMIDE PRECURSOR COMPOSITION AND USE THEREOF

TECHNICAL FIELD

The present invention relates to: (a) a polyimide precursor and a thermosetting resin composition, each of which is curable at low temperatures, excellent in long-term storage stability, and preferably usable as insulating material for electric and electronic purposes; (b) an alkaline aqueous solution-developable photosensitive resin composition which is curable at low temperatures, excellent in long-term storage stability, and usable as an insulating material for electric and electronic purposes; (c) a resin film, a cured film, and an insulating film, each of which is obtainable from (a) or (b); and (d) a printed wiring board provided with the insulating film.

BACKGROUND ART

Polyimide resin has excellent heat resistance, an excellent electrical insulating property, excellent chemical resistance, and a mechanical property, and therefore is used for electric and electronic purposes. For example, the polyimide resin is used as materials of (i) an isolation film and a protective coating agent provided on a semiconductor device, (ii) a surface protective material and a base material resin for a flexible circuit substrate, an integrated circuit, and the like, and (iii) an interlayer insulating film and a protective film for a fine circuit. Particularly, in a case where the polyimide resin is used as a coating material, the polyimide resin is used as (a) a protection material made by applying an adhesive agent on a shaped product such as a polyimide film, (b) a liquid-form polyimide resin solution, and the like.

The polyimide resin solution is roughly classified into two types: one type is a polyamide acid solution, which is a solution of a polyimide resin precursor; and the other type is a polyimide solution that contains polyimide resin soluble in an organic solvent. However, the polyamide acid solution and the polyimide solution are polymer solutions of a high molecular weight polymer and have a large molecular weight and low solubility to a solvent. This makes it difficult to prepare these solutions to have a high solute concentration, and therefore it is necessary to evaporate a large amount of the solvent in order to form a coating film, for example. This renders productivity of the coating film poor. Moreover, in a case of the polyamide acid solution, which is a solution of a polyimide resin precursor, an amide bond in its structure is easily degraded. On this account, the polyamide acid solution has poor stability. Particularly, when the solution is prepared to have a high concentration, a viscosity of the solution greatly changes, unfortunately. In view of this, the demand for a polyimide resin precursor solution having good solution storage stability is increased. Further, in the case of the solution of the polyimide resin precursor, it is necessary to imidize a coating film which is formed by applying the solution. At this time, the imidization should be carried out at a heat temperature of more than 300° C. However, in a case where the solution is used, for example, as a protection agent for a flexible substrate or the like, or as an adhesive agent to be applied on a shaped product, since wiring materials cannot endure a high temperature, it is necessary to use resin that is curable at low temperatures (not more than 200° C.) so as not to cause deterioration of wiring lines.

In relation to the techniques for these polyimide resin solutions, a copolymer having excellent solution storage stability is proposed which copolymer is obtained from a polyimide and a polyimide precursor (polyamide acid) having a specific structure. The copolymer is also referred to as a poly(amide acid-imide) copolymer (see Patent Literature 1).

Further, there has been also proposed polyamide acid which is curable at low temperatures of not more than 200° and which has a specific structure (see Patent Literature 2).

Moreover, there has been proposed a method for producing a novel polyamide acid in which method the polyamide acid is controlled to have a given low molecular weight so that the polyamide acid can be stably produced so as to have a high concentration and a low viscosity, with high reproducibility (see Patent Literature 3).

Further, there has been proposed a composition for a polyimide insulating film, which composition is made by use of an imide siloxane oligomer having a half-esterified terminal (see, for example, Patent Literature 4).

CITATION LIST

[Patent Literature 1]
Japanese Patent Application Publication, Tokukai, No. 2005-336243 A
[Patent Literature 2]
Japanese Patent Application Publication, Tokukai, No. 2008-308553 A
[Patent Literature 3]
Japanese Patent Application Publication, Tokukai, No. 2008-144159 A
[Patent Literature 4]
Japanese Patent Application Publication, Tokukai, No. 2001-89656 A

SUMMARY OF INVENTION

Technical Problem

Patent Literatures disclose various methods to solve the problems related to the polyimide resin solution. The copolymer, disclosed in Patent Literature 1, obtained from a polyimide and a polyimide precursor (polyamide acid) having a specific structure, i.e., the poly(amide acid-imide) copolymer, has a structure in which an imidized structured is introduced into a part of a polyamide acid structure, so that the copolymer is excellent in solution storage stability. However, the copolymer has such a problem that it is difficult to prepare a solution of the copolymer with a high concentration and a low viscosity because of its molecular weight controllability and structure, and further, it is difficult to cure the obtainable solution of the copolymer at low temperatures of not more than 200° C. The polyamide acid having a specific structure, disclosed in Patent Literature 2, has an aliphatic long-chain flexible skeleton in a molecule. This allows the polyamide acid to have a low glass transition temperature of a polymer and to be curable at low temperatures of not more than 200° C. However, the polyamide acid has poor solution storage stability at room temperature, and an obtainable solution of the polyamide acid has viscosity that largely changes. The polyamide acid solution, disclosed in Patent Literature 3, which is controlled to have a given low molecular weight can be prepared with a low viscosity and a high solid content. However, the polyamide acid solution has poor solution storage stability, and its viscosity largely changes. Further, it is difficult to cure the polyamide acid solution at low temperatures of not more than 200° C. The composition for a polyimide insulating film, disclosed in Patent Literature 4, prepared by use of an imide siloxane oligomer having a half-esterified terminal uses an imide siloxane oligomer having a half-esterified terminal as such. This allows an obtainable polyimide resin solution of the composition to have a low viscosity and a high solid content, to have excellent solution storage stability at room temperature, and to be curable at low temperatures of not more than 200° C. However, the composition has a siloxane skeleton in a molecule. This causes impurities contained in siloxane diamine, which is a raw material, to bleed out from a cured film, thereby inducing malfunction of a semiconductor. Further, in a case where a cured film made from a resin composition that has a siloxane skeleton is used as a circuit substrate material, the cured film is poor in surface wettability, thereby rendering adhesiveness of the cured film to various sealing agents poor.

Solution to Problem

As a result of diligent study of inventors of the present invention to solve the problems, they found a fact that a partially imidized polyimide precursor having a urethane bond is curable at low temperatures and it is possible to obtain a polyimide cured film having excellent physical properties, from the polyimide precursor. That is, a polyimide precursor solution that contains a partially imidized polyimide precursor having a urethane bond exhibits excellent solution storage stability at room temperature and a low viscosity even though the solution is prepared to have a high concentration of solute dissolved therein. In addition, the inventors also found a fact that with the use of the solution, it is possible to form a polyimide cured film having various excellent physical properties. Based on these facts, the inventors accomplished the present invention. The present invention can solve the problems by a polyimide precursor having a novel structure as described below.

That is, the present invention relates to a partially imidized polyimide precursor having a urethane bond.

It is preferable that the polyimide precursor further has a polycarbonate skeleton.

The polyimide precursor of the present invention is preferably a polyimide precursor obtained by (i) reacting at least a (a) diol compound and a (b) diisocyanate compound so as to synthesize a terminal isocyanate compound, (ii) reacting the terminal isocyanate compound with a (c) tetracarboxylic acid dianhydride so as to synthesize a urethane imide oligomer having a terminal acid anhydride, and (iii) carrying out an addition reaction of the urethane imide oligomer having a terminal acid anhydride, with a (d) diamine, the (a) diol compound being represented by General Formula (1):

[Chem. 1]

HO—R—OH (1)

(wherein R represents a divalent organic group),
the (b) diisocyanate compound being represented by General Formula (2):

[Chem. 2]

O=C=N—X—N=C=O (2)

(wherein X represents a divalent organic group),
the (c) tetracarboxylic acid dianhydride being represented by General Formula (3):

[Chem. 3]

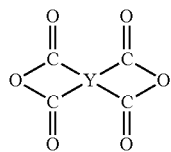

(3)

(wherein Y represents a tetravalent organic group), and the (d) diamine being represented by General Formula (4):

[Chem. 4]

H$_2$N-z-NH$_2$ (4)

(wherein Z represents a divalent organic group).

Further, in the polyimide precursor of the present invention, it is preferable that the (a) diol compound contain at least a polycarbonate diol represented by General Formula (5):

[Chem. 5]

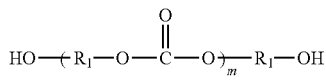

(5)

(wherein each $R_1$ independently represents a divalent organic group; and m represents an integer of 1 to 20).

It is preferable that the polyimide precursor of the present invention further have a carboxyl group in its side chain.

A photosensitive resin composition of the present invention contains at least: the (A) partially imidized polyimide precursor having a urethane bond; a (B) photosensitive resin; and a (C) photopolymerization initiator.

In the photosensitive resin composition of the present invention, it is preferable that the (A) partially imidized polyimide precursor having a urethane bond, the (B) photosensitive resin, and the (C) photopolymerization initiator be contained in the photosensitive resin composition such that the (B) photosensitive resin and the (C) photopolymerization initiator are contained by 10 to 200 parts by weight and by 0.1 to 50 parts by weight, respectively, relative to 100 parts by weight of a solid content of the (A) partially imidized polyimide precursor having a urethane bond.

It is preferable that the photosensitive resin composition of the present invention further contain a (D) thermosetting resin.

In the photosensitive resin composition of the present invention, it is preferable that the (D) thermosetting resin be contained in the photosensitive resin composition by 0.5 to 100 parts by weight relative to 100 parts by weight of a total solid content of the (A) partially imidized polyimide precursor having a urethane bond, the (B) photosensitive resin, and the (C) photopolymerization initiator.

A thermosetting resin composition of the present invention contains at least: the polyimide precursor composition; and a (D) thermosetting resin.

In the thermosetting resin composition of the present invention, it is preferable that the (D) thermosetting resin be contained in the thermosetting resin composition by 0.5 to 100 parts by weight relative to 100 parts by weight of a solid content of the (A) partially imidized polyimide precursor having a urethane bond.

A polyimide precursor composition solution of the present invention is a polyimide precursor composition solution obtained by dissolving, in an organic solvent, the polyimide precursor, the photosensitive resin composition, or the thermosetting resin composition.

A resin film of the present invention is a resin film obtained by applying, to a surface of a base material, the polyimide precursor composition solution, and drying the polyimide precursor composition solution thus applied.

An insulating film of the present invention is an insulating film obtained by curing the resin film.

A printed wiring board, of the present invention, provided with an insulating film is arranged such that the printed wiring board is covered with the insulating film.

Advantageous Effects of Invention

When the polyimide precursor of the present invention is dissolved in an organic solvent, an obtained solution has a low viscosity despite having a high concentration of solute dissolve therein, and is excellent in solution storage stability at room temperature. Further, a polyimide cured film obtainable from the polyimide precursor of the present invention is excellent in adhesiveness of a coating film, stability in environmental resistance test, chemical resistance, flexibility, and wettability of a coating film, and has excellent physical properties. In view of this, the polyimide precursor of the present invention is usable for a protective film or the like for various circuit substrates and yields excellent effects. Further, a photosensitive resin composition and a thermosetting resin composition each obtained by use of the polyimide precursor of the present invention are curable at low temperatures and exhibit various excellent properties when they are applied to a wiring board and formed into a shaped product.

BRIEF DESCRIPTION OF DRAWINGS

FIG. 1 is a schematic view of measuring how much a film is warped.

DESCRIPTION OF EMBODIMENTS

The following describes the present invention more specifically, in the order from (I) a polyimide precursor, (II) a photosensitive resin composition, (III) a thermosetting resin composition, (IV) a polyimide precursor composition solution, and (V) how to use a polyimide precursor composition.

(I) Polyimide Precursor

A polyimide precursor of the present invention is a partially imidized polyimide precursor having a urethane bond. The polyimide precursor (i) has at least a polyamide acid structure and a urethane structure inside a molecular chain, (ii) has an imide ring that is partially closed, and (iii) has a number-average molecular weight of not less than 1,000, more preferably not less than 5,000, based on polyethylene glycol. When the polyimide precursor has such a structure, it is possible to increase a concentration of a solution prepared by dissolving the polyimide precursor in a solvent, and to restrain that viscosity of the solution changes over time (i.e., the solution changes in molecular weight) when stored at room temperature.

More specifically, in the present invention, the partially imidized polyimide precursor having a urethane bond is a compound (I) which has at least one repeating unit having a urethane bond, the repeating unit being represented by General Formula (6):

[Chem. 6]

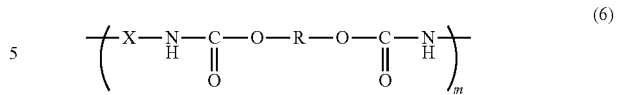

(6)

(wherein R and X each independently represent a divalent organic group; and m represents an integer of not less than 1), (ii) which has an imide bond represented by General Formula (7):

[Chem. 7]

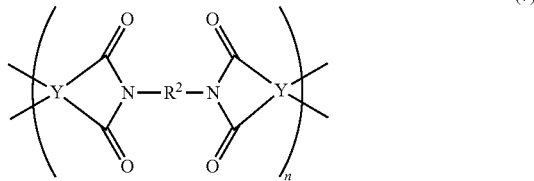

(7)

(wherein $R^2$ independently represents a divalent organic group; each Y independently represents a tetravalent organic group; and n represents an integer of not less than 1), and (iii) which has a polyamide acid structure represented by General Formula (8):

[Chem. 8]

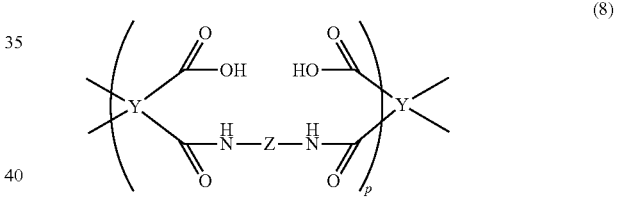

(8)

(wherein Z independently represents a divalent organic group; each Y independently represents a tetravalent organic group; and p represents an integer of not less than 1).

Further, the partially imidized polyimide precursor having a urethane bond, according to the present invention, has a number-average molecular weight of preferably not less than 1,000 but not more than 1,000,000, more preferably, not less than 5,000 but not more than 500,000, particularly preferably not less than 10,000 but not more than 200,000, based on polyethylene glycol. When a reaction is carried out by controlling the number-average molecular weight within the above range, it is possible to increase a concentration of a solution obtainable by dissolving the polyimide precursor in a solvent, and to prepare the solution to have a low viscosity.

The partially imidized polyimide precursor having a urethane bond, according to the present invention, has a flexible urethane bond in its structure. This allows an imidization reaction for closing an amide acid structure to be promoted at low temperatures of not more than 200° C. Further, a cured film formed by use of the partially imidized polyimide precursor having a urethane bond is excellent in flexibility and surface wettability, and has excellent adhesiveness to various sealing agents.

Further, it is preferable that the partially imidized polyimide precursor of the present invention which has a urethane bond include, in its structure, a polycarbonate skeleton. Such a structure makes it possible to further improve an obtainable cured film in terms of heat resistance, flexibility, water resistance, chemical resistance, and electrical insulating reliability at high temperatures and high humidity.

The partially imidized polyimide precursor having a urethane bond, used in the present invention, is not limited in particular provided that it has the above structure, but is more preferably a polyimide precursor obtained by (i) reacting at least a (a) diol compound and a (b) diisocyanate compound, so as to synthesize a terminal isocyanate compound, the (a) diol compound being represented by General Formula (1):

[Chem. 9]

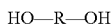  (1)

(wherein R represents a divalent organic group), and the (b) diisocyanate compound being represented by General Formula (2):

[Chem. 10]

O=C=N—X—N=C=O  (2)

(wherein X represents a divalent organic group), and (ii) reacting the terminal isocyanate compound thus synthesized, with a (c) tetracarboxylic acid dianhydride, so as to synthesize a urethane imide oligomer having a terminal acid anhydride, the (c) tetracarboxylic acid dianhydride being represented by General Formula (3):

[Chem. 11]

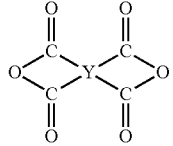  (3)

(wherein Y represents a tetravalent organic group), and (iii) reacting the urethane imide oligomer having a terminal acid anhydride, with a (d) diamine compound represented by General Formula (4):

[Chem. 12]

H$_2$N-z-NH$_2$  (4)

(wherein Z represents a divalent organic group).

<(a) Diol Compound>

The (a) diol compound used in the present invention is a branched or straight-chain compound having two hydroxyl groups in a molecule, as represented by General Formula (1):

[Chem. 13]

HO—R—OH  (1)

wherein R represents a divalent organic group.

The (a) diol compound is not particularly limited provided that it has the above structure. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol, and 1,4-cyclohexanedimethanol; carboxyl group-containing diols such as dimethylolpropionic acid (2,2-bis(hydroxymethyl)propionic acid), dimethylol butanoic acid (2,2-bis(hydroxymethyl) butanoic acid), 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, and 3,5-dihydroxybenzoic acid; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol and polybasic acid; a polycarbonate diol having a carbonate skeleton; a polycaprolactone diol obtained by carrying out ring opening addition of lactones such as γ-butyl lactone, ε-caprolactone, and δ-valerolactone; bisphenol A, an ethylene oxide adduct of bisphenol A, a propylene oxide adduct of bisphenol A, hydrogenated bisphenol A, an ethylene oxide adduct of hydrogenated bisphenol A, a propylene oxide adduct of hydrogenated bisphenol A, and the like. These compounds can be used solely, or two or more types thereof can be used in combination.

It is especially preferable to use, as the (a) diol compound, a polycarbonate diol represented by General Formula (4):

[Chem. 14]

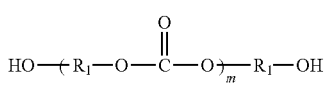  (5)

wherein each R$_1$ independently represents a divalent organic group; and m represents an integer of 1 to 20. This is because an obtainable cured film can be further improved in heat resistance, flexibility, water resistance, chemical resistance, and electrical insulating reliability at a high temperature and a high humidity.

Specific examples of the polycarbonate diol encompass the following commercial products: trade names PCDL T-4671, T-4672, T-4691, T-4692, T-5650J, T-5651, T-5652, T-6001, and T-6002, each of which is manufactured by Asahi Kasei Chemicals Corporation; trade names PLACCEL CD CD205, CD205PL, CD205HL, CD210, CD210PL, CD210HL, CD220, CD220PL, and CD220HL, each of which is manufactured by Daicel Chemical Industries, Ltd.; trade names Kuraray Polyol C-1015N, C-1050, C-1065N, C-1090, C-2015N, C-2065N, and C-2090, each of which is manufactured by Kuraray Co., Ltd.; and trade names NIPPOLLAN 981, 980R, and 982R, each of which is manufactured by Nippon Polyurethane Industry Co., Ltd. These products can be used solely, or two or more types thereof can be used in combination. The polycarbonate diol has a number-average molecular weight of preferably 500 to 5,000, more preferably 750 to 2,500, particularly preferably 1,000 to 2,000, based on polystyrene. When the number-average molecular weight of the polycarbonate diol is within the range, an obtainable cured film can be improved in chemical resistance and flexibility. In a case where the number-average molecular weight is less than 500, the flexibility of an obtainable cured film may be decreased in some cases. Further, in a case where the number-average molecular weight is 5000 or more, the solvent solubility of the partially imidized polyimide precursor having a urethane bond may be decreased in some cases.

Further, it is preferable that the polycarbonate diol and the carboxyl group-containing diol be used in combination. In this case, it is possible to introduce a carboxyl group into a side chain of an obtainable partially imidized polyimide precursor having a urethane bond. This increases branch points in a main chain of the partially imidized polyimide precursor having a urethane bond, thereby decreasing crystallinity.

Hence, the solvent solubility of the partially imidized polyimide precursor having a urethane bond can be improved.

<(b) Diisocyanate Compound>

The (b) diisocyanate compound used in the present invention is a compound having two isocyanate groups in a molecule, as represented by General Formula (2):

[Chem. 15]

(2)

wherein X represents a divalent organic group.

Examples of the (b) diisocyanate compound encompass, for example: aromatic diisocyanate compounds such as diphenylmethane-2,4'-diisocyanate, 3,2'- or 3,3'- or 4,2'- or 4,3'- or 5,2'- or 5,3'- or 6,2'- or 6,3'-dimethyl diphenylmethane-2,4'-diisocyanate, 3,2'- or 3,3'- or 4,2'- or 4,3'- or 5,2'- or 5,3'- or 6,2'- or 6,3'-diethyl diphenylmethane-2,4'-diisocyanate, 3,2'- or 3,3'- or 4,2'- or 4,3'- or 5,2'- or 5,3'- or 6,2'- or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. These compounds can be used solely, or two or more types of them can be used in combination. The use of such a compound is preferable because a resultant cured film can be improved in heat resistance. Further, it is also possible to use a compound that is stabilized with a block agent necessary for avoiding a change over time. The block agent is not especially limited, and may be, for example, alcohol, phenol, oxime, or the like.

The (b) diisocyanate compound is particularly preferably diphenylmethane-4,4'-diisocyanate, diphenylmethane-3,3'-diisocyanate, diphenylmethane-3,4'-diisocyanate, tolylene-2,4-diisocyanate, tolylene-2,6-diisocyanate, or norbornene diisocyanate. These compounds are preferable because they can further improve a resultant cured film in heat resistance and water resistance.

Further, in order to improve developing properties of the photosensitive resin composition, the (b) diisocyanate compound to be used preferably is tolylene-2,6-diisocyanate, tolylene-2,4-diisocyanate, and 1,6-hexamethylene diisocyanate.

<Synthesis Method of Terminal Isocyanate Compound>

A synthesis method used in the present invention for synthesizing a terminal isocyanate compound by reacting the (a) diol compound and the (b) diisocyanate compound is such that the diol compound and the diisocyanate compound are reacted with each other without solvent or in an organic solvent. In the reaction, the diol compound and the diisocyanate compound are mixed such that a ratio of the number of isocyanate groups to the number of hydroxyl groups (i.e., isocyanate group/hydroxyl group) is not less than 1 but not more than 2.10, more preferably not less than 1.10 but not more than 2.10, further preferably not less than 1.90 but not more than 2.10.

Further, in a case where two or more types of the (a) diol compound are used, the reaction thereof with the (b) diisocyanate compound may be carried out after the two or more types of the (a) diol compound are mixed, or each of the two or more types of the (a) diol compound may be reacted with the (b) diisocyanate compound, independently. Alternatively, the reaction may be carried out such that (i) a (a) diol compound is initially reacted with the (b) diisocyanate compound, (ii) a resultant terminal isocyanate compound is reacted with another (a) diol compound, and (iii) a reactant is further reacted with the (b) diisocyanate compound. Further, in a case where two or more types of the (b) diisocyanate compound are used, the reaction can be carried out in the same manner as above. In this way, an intended terminal isocyanate compound can be prepared.

The reaction between (a) and (b) is carried out at a temperature of, preferably, 40 to 160° C., more preferably 60 to 150° C. If the temperature is less than 40° C., it takes too much time for the reaction. If the temperature exceeds 160° C., a three-dimensional reaction occurs during the reaction, which easily causes gelatinization. How long the reaction is carried out can be determined appropriately depending on a batch scale and a reaction condition to be employed. Further, optionally, the reaction may be carried out in the presence of a catalyst such as tertiary amines or a metal or semi-metal compound (for example, alkaline metal, alkaline earth metal, tin, zinc, titanium, or cobalt).

The above reaction can be carried out without any solvent. However, in order to control the reaction, it is preferable to carry out the reaction by use of an organic solvent. Examples of the organic solvents encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; γ-butyrolactone; and the like. Further, these organic solvents can be used optionally in combination with an aromatic hydrocarbon such as xylene or toluene, as needed.

Further examples of the organic solvent that can be used are solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Among these solvents, it is preferable to use the symmetric glycol dieters, because the symmetric glycol dieters hardly cause side reaction.

It is desirable that the solvent used in the reaction be added so that a solute weight concentration in a reaction solution, i.e., a concentration of the reaction solution is not less than 5% by weight but not more than 90% by weight. The solute weight concentration in the reaction solution is more desirably not less than 10% by weight but not more than 80% by weight. In a case where the concentration of the reaction solution is 5% by weight or less, it is difficult to cause a polymerization reaction and a reaction speed decreases. This may result in that an intended structural substance cannot be prepared. For this reason, the concentration of 5% by weight or less is not preferable.

Further, as for the terminal isocyanate compound obtained as a result of the reaction, an isocyanate group provided at a resin terminal can be blocked with a blocking agent such as alcohols, lactums, or oximes, after the synthesis is completed.

<Urethane Imide Oligomer Having Terminal Acid Anhydride>

The urethane imide oligomer having a terminal acid anhydride, used in the present invention, can be prepared by reacting the terminal isocyanate compound synthesized in the aforementioned manner, with a tetracarboxylic acid dianhydride. The terminal isocyanate compound and the tetracarboxylic acid dianhydride are mixed such that a ratio of the number of acid dianhydride groups to the number of isocyanate groups (i.e., acid dianhydride group/isocyanate group) is preferably not more than 2.10, more preferably not less than 1.10 but not more than 2.10, further preferably not less than 1.90 but not more than 2.10. The reaction between the terminal isocyanate compound and the tetracarboxylic acid dianhydride may be carried out with the use of the solvent that is used for synthesis of the terminal isocyanate compound. Optionally, a solvent as exemplified above may be further added.

<Tetracarboxylic Acid Dianhydride>

As the tetracarboxylic acid dianhydride for use in synthesizing the partially imidized polyimide precursor having a urethane bond, in the present invention, it is possible to use tetracarboxylic acid dianhydrides such as 3,3',4,4'-benzophenone tetracarboxylic acid dianhydride, pyromellitic acid dianhydride, 3,3',4,4'-oxydiphthalic acid dianhydride, 2,2-bis[4-(3,4-dicarboxyphenoxy)phenyl]propane dibenzoate-3,3',4,4'-tetracarboxylic acid dianhydride, 3,3',4,4'-diphenyl sulfone tetracarboxylic acid dianhydride, 3,3',4,4'-biphenyltetracarboxylic acid dianhydride, 2,3,3',4-biphenyltetracarboxylic acid dianhydride, and 5-(2,5-dioxotetrahydro-3-furanyl)-3-methyl-3-cyclohexene-1,2-dicarboxylic acid anhydride.

The tetracarboxylic acid dianhydride for use in synthesizing the partially imidized polyimide precursor having a urethane bond is more preferably 2,2-bis[4-(3,4-dicarboxyphenoxy)phenyl]propane dianhydride, 3,3',4,4'-diphenyl sulfone tetracarboxylic acid dianhydride, 3,3',4,4'-oxydiphthalic acid dianhydride. With the use of such a tetracarboxylic acid dianhydride, it is possible to improve (i) an obtainable partially imidized polyimide precursor having a urethane bond in terms of solubility in organic solvent and (ii) an obtainable cured film in terms of chemical resistance.

Further, the tetracarboxylic acid dianhydride is further preferably 2,2-bis[4-(3,4-dicarboxyphenoxy)phenyl]propane dianhydride or 5-(2,5-dioxotetrahydro-3-furanyl)-3-methyl-3-cyclohexene-1,2-dicarboxylic acid anhydride, from the viewpoint of compatibility to other materials contained in a thermosetting resin composition to be prepared.

The tetracarboxylic acid dianhydride used in the present invention is added preferably by not less than 1.50 mol but not more than 4.00 mol relative to 1 mol of polyol (more specifically, a diol compound) used for preparing the terminal isocyanate compound, from the viewpoint of preparing the partially imidized polyimide precursor having a urethane bond so as to have excellent flexibility. The tetracarboxylic acid dianhydride is added particularly preferably by not less than 1.70 mol but not more than 3.00 mol. When the tetracarboxylic acid dianhydride is added in the above range, it is possible to reduce an amount of the tetracarboxylic acid dianhydride that does not contribute to the reaction.

<Method for Producing Urethane Imide Oligomer Having Terminal Acid Anhydride>

In producing the partially imidized polyimide precursor having a urethane bond, various methods can be used as a method for reacting the terminal isocyanate corn-pound and the tetracarboxylic acid dianhydride. The following describes typical methods, but any method can be used as long as a tetracarboxylic acid dianhydride can be provided at a terminal of a resultant urethane imide oligomer.

Method 1: A tetracarboxylic acid dianhydride is dispersed or dissolved in an organic solvent, and then a terminal isocyanate compound is gradually added therein. A reaction temperature at this time is not less than 100° C. but not more than 300° C., more preferably not less than 140° C. but not more than 250° C. It is preferable that the reaction occur at the same time as addition of the terminal isocyanate compound during heating at such a temperature, so as to promote imidization. Such a method can be also employed that a terminal isocyanate compound and a tetracarboxylic acid dianhydride are completely dissolved at low temperatures, and a resultant mixture is heated to a high temperature so that the resultant mixture is imidized.

Method 2: A tetracarboxylic acid dianhydride is dispersed or dissolved in an organic solvent, and a terminal isocyanate compound is gradually added in a resultant mixture and dissolved therein. An obtained solution that is evenly dissolved is heated and dried in a vacuum pressure drier heated at not less than 100° C. but not more than 250° C., while air is evacuated, thereby carrying out imidization.

<Synthesis of Partially Imidized Polyimide Precursor Having Urethane Bond>

The partially imidized polyimide precursor having a urethane bond is obtainable by reacting the urethane imide oligomer having a terminal acid anhydride thus prepared in the above method, with a diamino compound.

The diamino compound used in the present invention is a compound having two amino groups. The diamino compound is preferably an aromatic diamine represented by General Formula (4):

[Chem. 16]

wherein Z represents a divalent organic group.

More specifically, examples of the diamino compound encompass: diamino phenols such as m-phenylenediamine, o-phenylenediamine, p-phenylenediamine, m-aminobenzylamine, p-aminobenzylamine, bis(3-aminophenyl)sulfide, (3-aminophenyl) (4-aminophenyl) sulfide, bis(4-aminophenyl)sulfide, bis(3-aminophenyl)sulfoxide, (3-aminophenyl)(4-aminophenyl)sulfoxide, bis(4-aminophenyl)sulfoxide, bis(3-aminophenyl)sulfone, (3-aminophenyl)(4-aminophenyl)sulfone, bis(4-aminophenyl)sulfone, 3-4'-diaminobenzophenone, 4,4'-diaminobenzophenone, 3,3'-diaminobenzophenone, 3,3'-diaminodiphenylmethane, 3,4'-diaminodiphenylmethane, 4,4'-diaminodiphenylmethane, 4,4'-diaminodiphenylether, 3,3'-diaminodiphenylether, 3,4'-diaminodiphenylether, bis[4-(3-aminophenoxy)phenyl]sulfoxide, bis[4-(4-aminophenoxy)phenyl]sulfoxide, (4-aminophenoxyphenyl)(3-aminophenoxyphenyl)phenyl]

sulfoxide, bis[4-(3-aminophenoxy)phenyl]sulfone, bis[4-(aminophenoxy)phenyl]sulfone, (4-aminophenoxyphenyl)(3-aminophenoxyphenyl)phenyl]sulfone, bis[4-(3-aminophenoxy)phenyl]sulfide, bis[4-(aminophenoxy)phenyl]sulfide, (4-aminophenoxyphenyl)(3-aminophenoxyphenyl)phenyl]sulfide, 3,3'-diaminobenzanilide, 3,4'-diaminobenzanilide, 4,4'-diaminobenzanilide, bis[4-(3-aminophenoxy)phenyl]methane, bis[4-(4-aminophenoxy)phenyl]methane, [4-(4-aminophenoxyphenyl)][4-(3-aminophenoxyphenyl)]methane, 1,1-bis[4-(3-aminophenoxy)phenyl]ethane, 1,1-bis[4-(4-aminophenoxy)phenyl]ethane, 1,1-[4-(4-aminophenoxyphenyl)][4-(3-aminophenoxyphenyl)]ethane, 1,2-bis[4-(3-aminophenoxy)phenyl]ethane, 1,2-bis[4-(4-aminophenoxy)phenyl]ethane, 1,2-[4-(4-aminophenoxyphenyl)][4-(3-aminophenoxyphenyl)]ethane, 2,2-bis[4-(3-aminophenoxy)phenyl]propane, 2,2-bis[4-(4-aminophenoxy)phenyl]propane, 2,2-[4-(4-aminophenoxyphenyl)][4-(3-aminophenoxyphenyl)]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)]-1,1,1,3,3,3-hexafluoropropane, 1,3-bis(3-aminophenoxy)benzene, 1,4-bis(4-aminophenoxy)benzene, 1,3-bis(4-aminophenoxy)benzene, 4,4'-bis(4-aminophenoxy)biphenyl, 4,4'-bis(3-aminophenoxy)biphenyl, bis[4-(3-aminophenoxy)phenyl]ketone, bis[4-(4-aminophenoxy)phenyl]ketone, bis[4-(3-aminophenoxy)phenyl]ether, bis[4-(4-aminophenoxy)phenyl]ether, polytetramethylene oxide-di-P-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 2,4-diaminobenzoic acid, 2,5-diaminobenzoic acid, 3,5-diaminobenzoic acid, 3,3'-diamino-4,4'-dicarboxybiphenyl, 4,4'-diamino-3,3'-dicarboxybiphenyl, 4,4'-diamino-2,2'-dicarboxybiphenyl, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 2,2-bis[4-amino-3-carboxyphenyl]hexafluoropropane, 3,3'-diamino-4,4'-dicarboxydiphenyl ether, 4,4'-diamino-3,3'-dicarboxydiphenyl ether, 4,4'-diamino-2,2'-dicarboxydiphenyl ether, 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, 2,3-diaminophenol, 2,4-diaminophenol, 2,5-diaminophenol, and 3,5-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; dihydroxydiphenylmethanes such as 3,3'-diamino-4,4'-dihydroxydiphenylmethane, 4,4'-diamino-3,3'-dihydroxydiphenylmethane, and 4,4'-diamino-2,2'-dihydroxydiphenylmethane; bis[hydroxyphenyl]propanes such as 2,2-bis[3-amino-4-hydroxyphenyl]propane and 2,2-bis[4-amino-3-hydroxyphenyl]propane; bis[hydroxyphenyl]hexafluoropropanes such as 2,2-bis[3-amino-4-hydroxyphenyl]hexafluoropropane and 2,2-bis[3-amino-4-hydroxyphenyl]hexafluoropropane; hydroxydiphenyl ethers such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; dihydroxydiphenyl sulfones such as 3,3'-diamino-4,4'-dihydroxydiphenyl sulfone, 4,4'-diamino-3,3'-dihydroxydiphenyl sulfone, and 4,4'-diamino-2,2'-dihydroxydiphenyl sulfone; dihydroxydiphenyl sulfides such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; dihydroxydiphenyl sulfoxides such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; bis[(hydroxyphenyl)phenyl]alkane compounds such as 2,2-bis[4-(4-amino-3-hydroxyphenoxy)phenyl]propane; bis(hydroxyphenoxy)biphenyl compounds such as 4,4'-bis(4-amino-3-hydroxyphenoxy)biphenyl; bis[(hydroxyphenoxy)phenyl]sulfone compounds such as 2,2-bis[4-(4-amino-3-hydroxyphenoxy)phenyl]sulfone; and bis(hydroxyphenoxy)biphenyl compounds such as 4,4'-diamino-3,3'-dihydroxydiphenylmethane, 4,4'-diamino-2,2'-dihydroxydiphenylmethane, 2,2-bis[3-amino-4-carboxyphenyl]propane, and 4,4'-bis(4-amino-3-hydroxyphenoxy)biphenyl. These compounds can be used solely, or two or more types thereof can be used in combination.

The diamino compound to be used for the synthesis of the partially imidized polyimide precursor having a urethane bond is more preferably an aromatic diamine such as m-phenylenediamine, bis(3-aminophenyl)sulfone, bis(4-aminophenyl)sulfone, 3,3'-diaminodiphenylmethane, bis[4-(3-aminophenoxy)phenyl]sulfone, bis[4-(3-aminophenoxy)phenyl]methane, 2,2-bis[4-(4-aminophenoxy)phenyl]propane, 1,3-bis(3-aminophenoxy)benzene, 1,4-bis(3-aminophenoxy)benzene, 1,4-bis(4-aminophenoxy)benzene, and 1,3-bis(4-aminophenoxy)benzene. Such an aromatic diamine is desirable because the use thereof improves an obtainable cured film in heat resistance.

(II) Photosensitive Resin Composition

One example of how the polyimide precursor of the present invention is used is a photosensitive resin composition. In view of this, the present invention also includes a photosensitive resin composition prepared by use of the polyimide precursor. The following describes the photosensitive resin composition according to the present invention. Needless to say, how the polyimide precursor of the present invention is used is not limited to the following example.

The photosensitive resin composition of the present invention may contain at least a (A) partially imidized polyimide precursor having a urethane bond, a (B) photosensitive resin, and a (C) photopolymerization initiator.

In the photosensitive resin composition of the present invention, as to the (A) partially imidized polyimide precursor having a urethane bond, a partially imidized polyimide precursor having a urethane bond which polyimide precursor is obtained by use of a polycarbonate diol is more preferably used. However, the (A) polyimide precursor is not limited to this.

Further, the photosensitive resin composition of the present invention may further contain a (D) thermosetting resin, besides the (A) partially imidized polyimide precursor having a urethane bond, the (B) photosensitive resin, and the (C) photopolymerization initiator.

Here, the inventors of the present invention found that the photosensitive resin composition of the present invention has excellent various properties. The reason thereof is presumed as follows.

That is, a polyimide obtained by heating the partially imidized polyimide precursor having a urethane bond has an imide skeleton and a urethane bond in a molecule. This structure allows the polyimide to be excellent in (i) heat resistance and electrical insulating reliability, each derived from the imide skeleton, and (ii) chemical resistance and flexibility, each derived from the urethane bond. Further, since the partially imidized polyimide precursor having a urethane bond has a carboxyl group derived from a polyamide acid, the polyimide precursor is soluble in a developing solution typified by a dilute alkaline aqueous solution. This allows an obtainable photosensitive resin composition to be finely processed by exposure and development Especially, a polyimide obtained by heating a partially imidized polyimide precursor having a urethane bond which polyimide precursor is prepared by use of a polycarbonate diol is excellent in flexibility and has a low moisture-absorption property.

Further, the polyimide obtained by heating the partially imidized polyimide precursor having a urethane bond has no siloxane skeleton in its molecular skeleton. Therefore, a cured film obtainable therefrom has a surface having good wettability and markedly excels in adhesiveness to various members. Besides, the cured film does not cause bleedout of impurities derived from a siloxane component. On this account, in a case where the cured film is used as an insulating film for a printed wiring board, no malfunction of a semiconductor is induced.

The (A) partially imidized polyimide precursor having a urethane bond has been already described in the aforementioned (I), and therefore is not explained here. The following describes the (B) photosensitive resin, the (C) photopolymerization initiator, the (D) thermosetting resin, other components, and a method for mixing the components (A) to (C) or (A) to (D).

<(B) Photosensitive Resin>

In the present invention, the (B) photosensitive resin is a resin in which, a chemical bond is formed by a photopolymerization initiator. The photosensitive resin is preferably a resin having at least one unsaturated double bond in a molecule. Moreover, the unsaturated double bond is preferably an acrylic group ($CH_2=CH-$ group), a methacryloyl group ($CH_2=C(CH_3)-$ group), or a vinyl group ($-CH=CH-$ group).

Preferable examples of the (B) photosensitive resin encompass, for example: bisphenol F EO-denatured (n=2 to 50) diacrylate, bisphenol A EO-denatured (n=2 to 50) diacrylate, bisphenol S EO-denatured (n=2 to 50) diacrylate, bisphenol F EO-denatured (n=2 to 50) dimethacrylate, bisphenol A EO-denatured (n=2 to 50) dimethacrylate, bisphenol S EO-denatured (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacyrlate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane; 2,2-bis[4-(methacryloxyethoxy)phenyl]propane, 2,2-bis[4-(methacryloxy diethoxy)phenyl]propane, 2,2-bis[4-(methacryloxy polyethoxy)phenyl]propane, polyethylene glycol diacrylate, tripropylene glycol diacrylate, polypropylene glycol diacrylate, 2,2-bis[4-(acryloxy diethoxy)phenyl]propane, 2,2-bis[4-(acryloxy polyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-mexanediol dimethacrylate, 1,9-nonanediol methacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy polyethoxy)phenyl]propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri (ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3-5-benzenecarboxylate, triallylamine, triallyl citrate, triallyl phosphate, allobarbital, diallylamine, diallyl dimethyl silane, diallyl disulfide, diallyl ether, diallyl cyanurate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, and the like. However, the (C) photosensitive resin preferably is not limited to the above examples. Especially, a diacrylate or methacrylate having 2 to 50 repeating units of EO (ethylene oxide) per molecule is preferable, and a diacrylate or methacrylate having 2 to 40 repeating units of EO per molecule is more preferable. When the diacrylate or methacrylate having 2 to 50 repeating units of EO is used, solubility of the photosensitive resin composition in an aqueous developing solution, which is typically represented by an alkaline aqueous solution, is improved, and the developing time is reduced. In addition to that, stress does not easily remain in a cured film prepared by curing the photosensitive resin composition. For example, when the photosensitive resin composition is laminated on a flexible printed wiring board (as one example of printed wiring boards) which includes a polyimide resin as a base material, curling of the printed wiring board can be restrained.

It is especially preferable to use the EO-denatured diacrylate or a dimethacrylate, and an acrylic resin having at least three acrylic groups or methacrylic groups in combination, in view of improving developing properties. Examples of the acrylic resin that is suitably used encompass: ethoxylated isocyanuric acid EO-denatured triacrylate, ethoxylated isocyanuric acid EO-denatured trimethacrylate, ethoxylated trimethylolpropane triacrylate, ethoxylated trimethylolpropane triacrylate, ethoxylated trimethylolpropane triacrylate, trimethylolpropane triacrylate, propoxylated trimethylolpropane triacrylate, pentaerythritol triacrylate, ethoxylated pentaerythritol tetraacrylate, ethoxylated pentaerythritol tetraacrylate, ditrimethylolpropane tetraacrylate, ditrimethylolpropane tetraacrylate, propoxylated pentaerythritol tetraacrylate, pentaerythritol tetraacrylate, dipentaerythritol hexaacrylate, 2,2,2-trisacryloyloxymethylethyl succinic acid, 2,2,2-trisacryloyloxymethylethyl phthalic acid, propoxylated ditrimethylolpropane tetraacrylate, propoxylated dipentaerythritol hexaacrylate, ethoxylated isocyanuric acid triacrylate, ε-caprolactone denatured tris-(2-acryloxyethyl) isocyanurate, caprolactone denatured ditrimethylolpropane tetraacrylate, a compound represented by General Formula (9):

[Chem. 17]

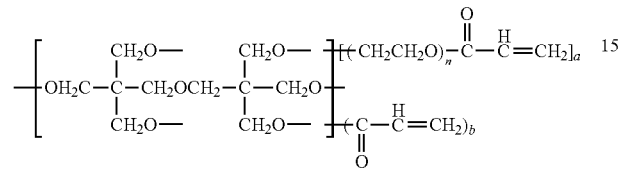

(9)

(wherein a+b=6, and n=12), a compound represented by General Formula (10):

[Chem. 18]

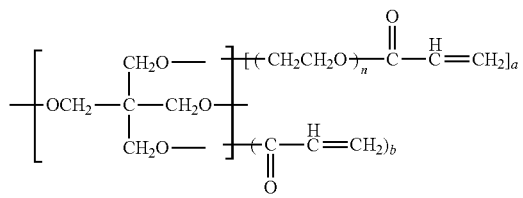

(10)

(wherein a+b=4, and n=4), a compound represented by General Formula (11):

[Chem. 19]

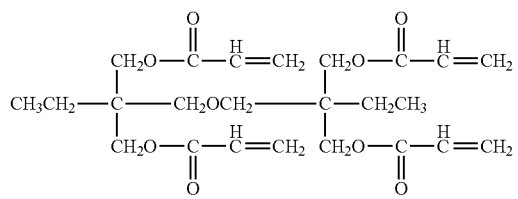

(11)

a compound represented by General Formula (12):

[Chem. 20]

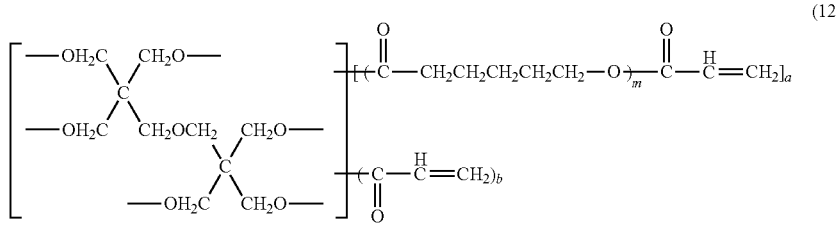

(12)

(wherein m=1, a=2, and b=4; or m=1, a=3, and b=3; or m=1, a=6, and b=0; or m=2, a=6, and b=0), a compound represented by General Formula (13):

[Chem. 21]

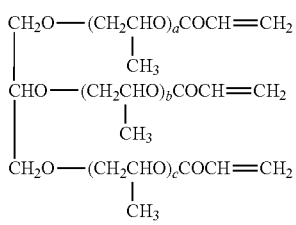

(13)

(wherein a+b+c=3.6), a compound represented by General Formula (14):

[Chem. 22]

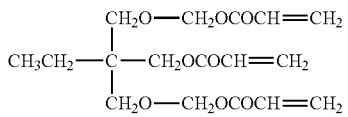

(14)

and a compound represented by General Formula (15):

[Chem. 23]

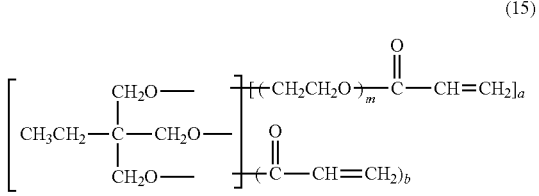

(15)

(wherein m·a=3 and a+b=3; "m·a" is a product of m and a).

Furthermore, compounds having a hydroxyl group and/or a carbonyl group in a molecular structural skeleton, such as 2-hydroxy-3-phenoxypropyl acrylate, phthalic acid monohydroxyethyl acrylate, ω-carboxy-polycaprolactone monoacrylate, acrylic acid dimer, pentaerythritol triacrylate, and pentaerythritol tetraacrylate are also preferably used.

Further, any other photosensitive resin, for example, epoxy-denatured acrylic (methacrylic) resins, urethane-denatured acrylic (methacrylic) resins, and polyester-denatured acrylic (methacrylic) resins, can be also used.

The photosensitive resin may be used solely. However, it is preferable to use two or more types of the photosensitive resins in combination, from the viewpoint of improving heat resistance of a cured film obtained after photo-curing.

<(C) Photopolymerization Initiator>

The (C) photopolymerization initiator in the present invention is a compound that is activated by energy of UV or the like, and initiates and promotes a reaction of a photosensitive resin. Examples of the (C) photopolymerization initiator encompass Michler's ketone, 4,4'-bis(diethylamino)benzophenone, 4,4',4"-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9,10-anthraquinone, methylanthraquinone, thioxanthone, 2,4-diethylthioxanthone, 2-isopropylthioxanthone, 1-hydroxycyclohexyl phenyl ketone, diacetylbenzyl, benzyl dimethyl ketal, benzyl diethyl ketal, 2(2'-furilethylidene)-4,6-bis(trichloromethyl)-S-triazine, 2[2'(5"-methylfuril)ethylidene]-4,6-bis(trichloromethyl)-S-triazine, 2(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethane-1-one, 1-hydroxy-cyclohexyl-phenyl-ketone, 2-hydroxy-2-methyl-1-phenyl-propane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)-butane-1-one, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrole-1-yl)-phenyl)titanium, 1,2-octanonedione, 1-[4-(phenylthio)-, 2-(O-benzoyloxime)], iodonium, (4-methylphenyl) [4-(2-methylpropyl)phenyl]-hexafluorophosphate(1-), ethyl-4-dimethylaminobenzoate, 2-ethylhexyl-4-dimethylaminobenzoate, ethanone, and 1-[9-ethyl-6-(2-methylbenzoyl)-9H-carbazol-3-yl]-1-(O-acetyloxime). The photopolymerization initiator is selected from among them, and further, it is preferable that one or more of the photopolymerization initiators be used in combination.

In the photosensitive resin composition of the present invention, it is preferable that the component (A), the component (B), and the component (C) be mixed such that, relative to 100 parts by weight of a solid content of the component (A), the component (B) is mixed by 10 to 200 parts by weight, and the component (C) is mixed by 0.1 to 50 parts by weight.

The above content ratio is preferable because a cured product and an insulting film that are ultimately obtained are improved in various properties (electrical insulating reliability and the like).

In a case where the amount of the component (B), i.e., the photosensitive resin is less than the above range, heat resistance of a cured coating film obtained by photo-curing the photosensitive resin composition is decreased and contrast of the cured coating film is not easily obtained when the cured coating film is exposed and developed. Therefore, such an amount of the (B) photosensitive resin is not preferable in some cases. When the (B) photosensitive resin is contained in the above range, it is possible to attain resolution of the cured coating film in an optimum range when the cured coating film is exposed and developed.

Further, in a case where the amount of the (C) photopolymerization initiator is less than the above range, it may become difficult to cause a curing reaction of an acrylic resin upon light irradiation, thereby often causing insufficient curing. In the meantime, if the (C) photopolymerization initiator is contained too much, it is difficult to adjust an irradiation amount of light, thereby causing overexposure in some cases. In view of this, in order to promote a photo-curing reaction effectively, it is preferable to adjust the amount of the (C) photopolymerization initiator in the above range.

<(D) Thermosetting Resin>

Examples of the thermosetting resin to be used in the photosensitive resin composition of the present invention encompass: thermosetting resins such as epoxy resin, isocyanate resin, block isocyanate resin, bismaleimide resin, bisallylnadiimide resin, acrylic resin, methacrylic resin, curable hydrosilyl resin, curable allyl resin, and unsaturated polyester resin; and side-chain reactive group type thermosetting polymers having a reactive group such as an allyl group, a vinyl group, an alkoxysilyl group, or a hydrosilyl group provided on a side chain or a terminal of its polymer chain. Only one type of the thermosetting components, i.e., the (D) thermosetting resin may be used solely, or at least two types thereof may be used in combination, as appropriate.

As the (D) thermosetting resin, it is more preferable to use the epoxy resin and the block isocyanate resin among them. By including these components, it is possible to impart, to a cured film obtainable by curing the photosensitive resin composition, not only heat resistance but also adhesiveness to a circuit substrate and a conductor such as a metal foil or the like.

The epoxy resin may be an epoxy resin having at least two epoxy groups in a molecule. Examples of such an epoxy resin are epoxy resins such as bisphenol A type epoxy resin, bisphenol AD type epoxy resin, bisphenol S type epoxy resin, bisphenol F type epoxy resin, bisphenol A novolac type epoxy resin, hydrogenated bisphenol A type epoxy resin, ethylene oxide added bisphenol A type epoxy resin, propylene oxide added bisphenol A type epoxy resin, novolac type epoxy resin, glycidyl ester type epoxy resin, biphenyl type epoxy resin, phenol novolac type epoxy resin, alkylphenol novolac type epoxy resin, polyglycol type epoxy resin, cycloaliphatic epoxy resin, cyclopentadiene type epoxy resin, dicyclopentadiene type epoxy resin, cresol novolac type epoxy resin, glycidylamine type epoxy resin, naphthalene type epoxy resin, urethane-denatured epoxy resin, rubber-denatured epoxy resin, and epoxy-denatured polysiloxane. These epoxy resins may be used solely or at least two types of the epoxy resins may be used in combination by an appropriate ratio.

Examples of the epoxy resin encompass: naphthalene type tetra-functional epoxy resin EPICLON HP-4700 (trade name), cyclopentadiene type epoxy resin EPICLON HP-7200 (trade name), phenol novolac type epoxy resin EPICLON N-740 (trade name), highly-heat-resistant epoxy resin EPICLON EXA-7240 (trade name), cresol novolac type multifunctional epoxy resins EPICLON N-660, N-665, N-670, N-680, and N-655-EXP (trade name), phenol novolac type epoxy resin EPICLON N-740 (trade name), tetraphenylethane type epoxy resin EPICLON ETePE (trade name), and triphenylmethane type epoxy resin EPICLON ETrPM (trade name), all of which are manufactured by Dainippon Ink and Chemicals Inc.; bisphenol A type epoxy resin EPICOAT 828 etc. (trade name) manufactured by Japan Epoxy Resins Co., Ltd.; bisphenol F type epoxy resins YDF-170 etc. (trade name) manufactured by Tohto Kasei Co., Ltd.); phenol novolac type epoxy resins, such as EPICOAT 152 and 154 (trade name) manufactured by Japan Epoxy Resins Co., Ltd., EPPN-201 (trade name) manufactured by Nippon Kayaku Co., Ltd., and DEN-438 (trade name) manufactured by The Dow Chemical Company; o-cresol novolac type epoxy resins such as EOCN-125S, 103S, and 104S (trade name), manufactured by Nippon Kayaku Co., Ltd.; multifunctional epoxy resins, such as Epon 1031S (trade name) manufactured by Japan Epoxy Resins Co., Ltd., Araldite 0163 (trade name) manufactured by CIBA Specialty Chemicals Inc., DENACOL EX-611, EX-614, EX-614B, EX-622, EX-512, EX-521, EX-421, EX-411, and EX-321 (trade name) manufactured by Nagase chemicals Co, Ltd.; amine type epoxy resins, such as EPICOAT 604 (trade name) manufactured by Japan Epoxy Resins Co., Ltd., YH434 (trade name) manufactured by Tohto Kasei Co., Ltd., TETRAD-X and TERRAD-C (trade name) manufactured by Mitsubishi Gas Chemical Company, Inc., GAN (trade name) manufactured by Nippon Kayaku Co., Ltd., and ELM-120 (trade name) manufactured by Sumitomo Chemical Co., Ltd.; heterocycle-containing epoxy resins such as Araldite PT810 etc. (trade name) manufactured by CIBA Specialty Chemicals Inc.; and cycloaliphatic epoxy resins such as ERL 4234, 4299, 4221, and 4206 (trade name) manufactured by UCC. The epoxy resins can be used solely, or two or more types thereof can be used in combination.

In addition to the above exemplified epoxy resins, the epoxy resin used in the present invention may be an epoxy compound that has just one epoxy group in one molecule, such as n-butyl glycidyl ether, phenyl glycidyl ether, dibromophenyl glycidyl ether, dibromocresyl glycidyl ether, or the like. Further, cycloaliphatic epoxy compounds such as 3,4-epoxycyclohexyl, and methyl(3,4-epoxycyclohexane)carboxylate can be used in combination.

Among these epoxy resins, the epoxy resin having at least two epoxy groups in a molecule is especially preferable in view of improving an obtainable photosensitive resin composition in heat resistance, solvent resistance, chemical resistance, and moisture resistance.

Here, the block isocyanate resin is a compound which is inactive at a room temperature but which, when heated, reproduces an isocyanate group due to dissociation of the blocking agent. The blocking agent may be, for example, oximes, diketones, phenols, caprolactams, or the like. Examples of the block isocyanate resin encompass: trade names DURANATE 17B-60PX, DURANATE TPA-B80E, DURANATE MF-B60X, DURANATE MF-K60X, and DURANATE E402-B80T, each of which is manufactured by Asahi Kasei Chemicals Corporation; trade names TAKENATE B-830, TAKENATE B-815N, TAKENATE B-846N, and TAKENATE B-882N, each of which is manufactured by Mitsui Chemical Polyurethane, Inc.; and trade names CORONATE AP-M, CORONATE 2503, CORONATE 2507, CORONATE 2513, CORONATE 2515, and MILLIONATE MS-50, each of which is manufactured by Nippon Polyurethane Industry Co., Ltd. The block isocyanate compounds to be particularly preferably used in the present invention may be, for example, hexamethylene diisocyanate-based isocyanurate type, biuret type, or adduct type block isocyanate compounds, hydrogenated diphenylmethane diisocyanate block isocyanate resins, and hydrogenated xylylene diisocyanate block isocyanate resins, each of which has a dissociation temperature of the blocking agent of not more than 160° C.

With the use of the block isocyanate resin, high adhesiveness to a based material can be imparted to a cured coating film obtained by curing the photosensitive resin composition. From this viewpoint, it is preferable to use the block isocyanate resin.

These block isocyanate resins can be used solely, or two or more types thereof can be used in combination.

Further, into the photosensitive resin composition of the present invention, a curing agent for curing the thermosetting resin may be added. For example, the following compounds can be used together as the curing agent: phenolic resins such as phenol novolac type phenolic resin, cresol novolac type phenolic resin, and naphthalene type phenolic resin; amino resins; urea resins; melamine resins; dicyandiamide; dihydrazine compounds; imidazole compounds; Lewis acid salts; Broensted acid salts; and polymercaptan compounds.

The thermosetting resin is contained in the photosensitive resin composition of the present invention preferably by 0.5 to 100 parts by weight, particularly preferably 1.0 to 50 parts by weight, relative to 100 parts by weight of a total solid content of the (A) partially imidized polyimide precursor having a urethane bond, the (B) photosensitive resin, and the (C) photopolymerization initiator. When the thermosetting resin is mixed in the above range, it is possible to improve an obtainable cured film of the photosensitive resin composition in heat resistance, chemical resistance, and electrical insulating reliability.

Further, in the photosensitive resin composition of the present invention, a curing accelerator may be used as well as the thermosetting resin. The curing accelerator is not especially limited. Examples of the curing accelerator encompass: phosphine-based compounds such as triphenylphosphine; amine-based compounds such as tertiary amine, trimethanolamine, triethanolamine, and tetraethanolamine; borate-based compounds such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. Among the above curing accelerators, it is more preferable to use the imidazoles such as 2-ethyl-4-methyl imidazole, 2-phenyl-4-methyl imidazole, and 2,4-diamino-6-[2'-undecylimidazolyl-(1')]-ethyl-s-triazine, from the viewpoint that the photosensitive resin composition can be improved in storage stability.

<Other Components>

The photosensitive resin composition of the present invention can further contain various additives, if necessary, such as a filler, an adhesive auxiliary agent, a defoaming agent, a leveling agent, a flame retardant, a coloring agent, and a polymerization inhibitor. As the filler, a fine inorganic filler such as silica, mica, talc, barium sulfate, wollastonite, or calcium carbonate; or a fine organic polymer filler may be contained. As the defoaming agent, a silicon-based compound or an acryl-based compound, for example, can be contained. The leveling agent to be contained may be a silicon-based compound or an acryl-based compound. Further, the flame retardant to be contained may be, for example, a phosphoric ester-based compound, a halogen-based compound, a metal hydroxide, an organophosphate-based compound, or the like. As the coloring agent to be contained, a phthalocyanine-based compound, an azo-based compound, carbon black, oxidized titanium, or the like can be used. Furthermore, the adhesive auxiliary agent (also called a tackifier) to be contained may be a silane coupling agent, a triazole-based compound, a tetrazole-based compound, a triazine-based compound, or the like. Further, as the polymerization inhibitor to be contained, for example, hydroquinone, hydroquinone monomethylether or the like can be used. These additives can be used solely, or two or more types thereof can be used in combination. Further, it is preferable to determine respective amounts of the additives to be contained as appropriate.

<Method for Mixing (A) to (C) or (A) to (D)>

The photosensitive resin composition of the present invention can be prepared by uniformly mixing the aforementioned components (A) to (C) or (A) to (D), and any of the above other components if necessary. A method for uniformly mixing these components is not particularly limited, and may be carried out by use of, for example, a general mixing device such as a three-roll or beads-mill device Further, in a case where an obtainable solution has a low viscosity, it is also possible to use a general stirring device to mix these components.

(III) Thermosetting Resin Composition

Another example of how the polyimide precursor of the present invention is used is a thermosetting resin composition. In view of this, the present invention also includes a thermosetting resin composition prepared by use of the polyimide precursor. Needless to say, how the polyimide precursor of the present invention is used is not limited to the following example.

The thermosetting resin composition of the present invention may contain at least a (A) partially imidized polyimide precursor having a urethane bond and a (D) thermosetting resin.

In the thermosetting resin composition, as to the (A) partially imidized polyimide precursor having a urethane bond, a partially imidized polyimide precursor having a urethane bond which polyimide precursor is obtained by use of a polycarbonate diol is more preferably used. However, the (A) polyimide precursor is not limited to this.

Further, the thermosetting resin composition of the present invention may further contain other components, besides the (A) partially imidized polyimide precursor having a urethane bond and the (D) thermosetting resin.

The component (A) has been already described in the aforementioned (I), and therefore is not explained here. Further, in regard to the (D) thermosetting resin and the other components, the ones exemplified in the aforementioned (II) can be used preferably.

The components (A) and (D) are contained in the thermosetting resin composition of the present invention such that the component (D) is mixed preferably by 0.5 to 100 parts by weight, relative to 100 parts by weight of a solid content of the component (A).

The above mixed ratio of the components (A) and (D) is preferable because a cured product and an insulting film that are ultimately obtained are improved in various properties (electrical insulating reliability and the like).

If the amount of the (D) thermosetting resin is more than the above range, a curing reaction of the polyimide precursor may be blocked, thereby resulting in that sufficient mechanical intensity cannot be obtained. In view of this, it is preferable that the polyimide precursor be prepared within the above range of the mixed ratio, so as to efficiently promote the curing reaction thereof.

<Method for Mixing (A) and (D)>

The thermosetting resin composition of the present invention can be prepared by uniformly mixing the aforementioned components (A) and (D), and any of the above other components if necessary. A method for uniformly mixing these components may be carried out by use of, for example, a general mixing device such as a three-roll or beads-mill device Further, in a case where an obtainable solution has a low viscosity, it is also possible to use a general stirring device to mix these components.

(IV) Polyimide Precursor Composition Solution

A polyimide precursor composition solution that is obtained by dissolving, in an organic solvent, the polyimide precursor of the present invention, the photosensitive resin composition of the present invention, or the thermosetting resin composition of the present invention is included in the present invention. The polyimide precursor, the photosensitive resin composition, and the thermosetting resin composition are highly soluble in various organic solvents. Examples of the organic solvents encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; phenol-based solvents such as phenol, o-, m-, or p-cresol, xylenol, halogenated phenol, and catechol; solvents of symmetric glycol diethers such as hexamethylphosphoramide, γ-butyrolactone, methyl monoglyme (1,2-dimethoxyethane), methyl diglyme (bis(2-methoxyethyl) ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis (2-ethoxyethyl)ether), and butyl diglyme (bis(2-butoxyethyl) ether); solvents of acetates such as γ-butyrolactone, N-methyl-2-pyrrolidone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Note that hexane, acetone, toluene, xylene or the like having a low boiling point may be used in combination if necessary.

Among these solvents, the solvents of the symmetric glycol diethers are particularly preferable because the polyimide precursor, the photosensitive resin composition, and the thermosetting resin composition are highly soluble therein.

For a polyimide precursor solution obtainable by dissolving the polyimide precursor of the present invention into an organic solvent, it is preferable that the organic solvent be mixed therein by not less than 10 parts by weight but not more than 200 parts by weight, relative to 100 parts by weight of a solid content of the component (A).

For a polyimide precursor composition solution obtainable by dissolving the photosensitive resin composition of the present invention into an organic solvent, it is preferable that the organic solvent be mixed therein by not less than 10 parts by weight but not more than 200 parts by weight, relative to 100 parts by weight of a total solid content of the components (A), (B), and (C), and optionally the component (D) if necessary.

For a polyimide precursor composition solution obtainable by dissolving the thermosetting resin composition of the present invention into an organic solvent, it is preferable that the organic solvent be mixed therein by not less than 10 parts by weight but not more than 200 parts by weight, relative to 100 parts by weight of a total solid content of the components (A) and (E).

The respective ranges of the mixed ratios for the above polyimide precursor composition solutions are preferable because (i) a rate of reduction in film thickness after drying is small and (ii) the polyimide precursor composition solutions can be adjusted to have a viscosity and stickiness in an appropriate range for application such as screen printing.

If the amount of the organic solvent is less than the above range, an obtainable polyimide precursor composition solution is prepared to have a very high viscosity. This makes it difficult to carry out application of the solution, and involution of air bubbles at the time of application and leveling properties may become poor. In the meantime, if the amount of the organic solvent is more than the above range, an obtainable polyimide precursor composition solution is prepared to have a very low viscosity. This makes it difficult to carry out application of the solution, and coatability of the solution with respect to a circuit may be rendered poor.

(V) Use of Polyimide Precursor Composition

The polyimide precursor of the present invention, the photosensitive resin composition of the present invention, or the thermosetting resin composition of the present invention can be formed into a cured film or patterned as follows directly or after the polyimide precursor composition solution is prepared. Initially, the polyimide precursor, the photosensitive resin composition, or the thermosetting resin composition is applied to a substrate. Alternatively, the polyimide precursor composition solution is applied to a substrate, and is dried so as to remove an organic solvent. The application of the polyimide precursor, the photosensitive resin composition, the thermosetting resin composition, or the polyimide precursor composition solution to the substrate may be carried out by screen printing, curtain rolling, reverse rolling, spray coating, rotational application by use of a spinner, or the like. An obtained applied film (having a thickness of preferably 5 to 100 μm, especially preferably 10 to 100 μm) is dried at not more than 120° C., preferably at 40° C. to 100° C.

For the photosensitive resin composition, after the applied film is dried, a negative photomask is placed on the applied film thus dried, and is irradiated with active light such as ultraviolet rays, visible light, or electron beams. Then, a portion, in the applied film, that is not exposed to light is washed with a developing solution by a method such as a shower method, a paddle method, a soaking method, an ultrasonic method, or the like method so as to form a relief pattern. Since the time required for the pattern to be exposed differs depending on (i) spray pressure and flow speed of the developing device and (ii) a temperature of the etching solution, it is preferable to find an optimum condition for the device as appropriate.

As the developing solution, an alkaline aqueous solution is preferably used. The developing solution may contain a water-soluble organic solvent such as methanol, ethanol, n-propanol, isopropanol, or N-methyl-2-pyrrolidone. Examples of alkaline compounds used for preparing the alkaline aqueous solution encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, triisopropylamine, and the like. Further, any other compounds are obviously usable as long as the aqueous solution exhibits basicity. The alkaline compound that is preferably used in the step of developing the photosensitive resin composition of the present invention has a concentration of preferably 0.01% to 20% by weight, especially preferably 0.02% to 10% by weight. A temperature of the developing solution depends on a composition of the photosensitive resin composition and a composition of the developing solution. Generally, the temperature of the developing solution is preferably not less than 0° C. but not more than 80° C., more preferably not less than 10° C. but not more than 60° C.

The relief pattern thus formed in the developing step is rinsed to remove unnecessary residues of the developing solution. Examples of a rinsing fluid used for the rinse may be water and an acidic aqueous solution.

Subsequently, a heat treatment is carried out on (a) the film thus obtained by applying to a substrate the polyimide precursor, the thermosetting resin composition, or the polyimide precursor composition solution thereof and then drying an applied film formed on the substrate, or (b) the relief patter obtained by applying to a substrate the photosensitive resin composition or the polyimide precursor composition solution thereof, and exposing and developing an applied-film formed on the substrate. By carrying out the heat treatment, a partially imidized polyimide precursor having a urethane bond is imidized, thereby preparing a cured film having excellent heat resistance. A thickness of the cured film is determined in consideration of a thickness of wiring lines and the like, but is preferably about 2 to 50 μm. As for a final curing temperature in the heat treatment, it is desirable that the imidization be carried out by heating at low temperatures so as to prevent oxidization of the wiring lines and the like and a decrease in adhesiveness of the wiring lines to a base material.

The imidization temperature at this time is preferably not less than 100° C. but not more than 250° C., further preferably not less than 120° C. but not more than 200° C., particularly preferably not less than 130° C. but not more than 180° C. It is not preferable that a final heat temperature be high, because deterioration of the wiring lines due to oxidation is promoted.

The cured film formed from the polyimide precursor of the present invention, the photosensitive resin composition of the present invention, or the thermosetting resin composition of the present invention is excellent in heat resistance and electrical and mechanical properties, and especially in flexibility.

Further, an insulating film obtainable from the photosensitive resin composition has a thickness of, preferably, about 2 to 50 μm. The insulating film upon photo-curing has a resolution of at least up to 10 μm, and in particular, a resolution of about 10 to 1000 μm. In view of this, the insulating film obtainable from the photosensitive resin composition is especially suitable as an insulating material for a high-density flexible substrate. Furthermore, the insulating film obtainable from the photosensitive resin composition is usable to various types of photo-curable wiring coating protective agents, photosensitive heat-resistant adhesives, insulating coatings of an electric wire and cable, and the like.

Further, an insulating film of the thermosetting resin composition, for example, has a thickness of preferably about 2 to 50 μm, and has excellent electrical insulating reliability, moisture resistance, and flexibility. In view of this, the insulating film obtainable from the thermosetting resin composition is particularly suitable as an insulating material for a flexible substrate, which is required to be highly flexible. Further, the insulating film obtainable from the thermosetting resin is usable as various types of heat-curable wiring coating protective agents, heat-resistant adhesives, insulating coatings of an electric wire and cable, and the like.

In the present invention, it is also possible to provide an insulating material like above with the use of a resin film obtained by applying, to a surface of a base material, the polyimide precursor composition solution, and drying the solution thus applied.

EXAMPLES

The following describes Examples of the present invention, more specifically. However, the present invention is not limited to Examples as below.

Synthesis Example 1

Synthesis of Partially Imidized Polyimide Precursor Having Urethane Bond

Into a separable flask under nitrogen pressure, there was added methyl triglyme (=1,2-bis(2-methoxyethoxy)ethane) (95 g) as a solvent for polymerization. Then, 20.7 g (0.1004 mol) of norbornene diisocyanate was added therein and heated to 80° C. so that the norbornene diisocyanate was dissolved in the solvent. Into a resultant solution was added, over 1 hour, a solution in which (i) 50.0 g (0.025 mol) of polycarbonate diol (trade name PCDL T5652, manufactured by Asahi Kasei Co., Ltd.: a polycarbonate diol having an average molecular weight of 2000, represented by General Formula (16):

[Chem. 24]

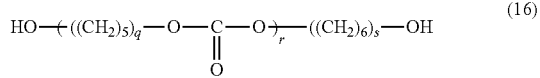

(16)

wherein q, r, and s are an integer of not less than 1), and (ii) 7.4 g (0.050 mol) of dimethylol butanoic acid (2,2-bis(hydroxymethyl)butanoic acid) were dissolved in methyl triglyme (50.0 g).

A resultant solution was stirred by heating at 80° C. for 5 hours. After a reaction was completed, 32.22 g (0.100 mol) of 3,3',4,4'-benzophenone tetracarboxylic acid dianhydride (hereinafter referred to as BTDA) and methyl triglyme (52.0 g) were added to the reactant solution. After these compounds were added, the reactant solution was heated to 200° C. for 3 hours to carry out a reaction. In this way, a solution of a urethane imide oligomer having a terminal acid anhydride was prepared. After the reaction was completed, the reactant solution was cooled down with ice to about 5° C.

Into the reactant solution, 21.92 g (0.075 mol) of 1,3-bis (3-aminophenoxy)benzene was added and stirred for 4 hours at 5° C., thereby preparing a partially imidized polyimide precursor, of the present invention, having a urethane bond (a weight-average molecular weight thereof was 80,000, and a number-average molecular weight thereof was 30,000). The solution had a solute concentration of 40% and a viscosity of 750 poise at 23° C.

Example 1

In order to examine storage stability of the polyimide precursor solution obtained in Synthesis Example 1, the polyimide precursor solution was hermetically sealed in a 10-ml screw tube and left for stand in a chamber maintained at 20° C. After one month, the viscosity of the solution was measured. An evaluation result is shown in Table 1. The evaluation was carried out based on the following definition:

(I) A solution in which the viscosity was changed by 10% or less after one month was evaluated as "G (Good)";
(II) A solution in which the viscosity was changed in a range from 10% to 30% after one month was evaluated as "U (Unsatisfactory)"; and
(III) A solution in which the viscosity was changed by 30% or more after one month was evaluated as "P (Poor)".

<Preparation of Cured Film on Polyimide Film>

With the use of a Baker's applicator, the polyimide precursor solution obtained in Synthesis Example 1 was flow-cast and applied to a polyimide film (manufactured by Kaneka Corporation: trade name 75NPI) having a thickness of 75 µm so that a finally dried film had a thickness of 25 µm. A resultant coating film was dried at 80° C. for 20 minutes, thereby preparing a resin film of the present invention on the polyimide film as a base. The resin film thus prepared was heated at 160° C. for 90 minutes in the air so that the resin film was imidized and formed into a cured film. In this way, a polyimide film laminate in which the cured film was provided on the polyimide film as a base was prepared.

<Evaluation of Cured Film>

The cured film thus prepared was evaluated in terms of the following items. Evaluation results are shown in Table 1.

(i) Adhesiveness of Cured Film

Adhesive strength of the cured film thus prepared was evaluated by a cross-cut tape method in accordance with JIS K5400, as follows:

(I) A cured film in which no detachment was observed in the cross-cut tape method was evaluated as "G (Good)";
(II) A cured film in which half or more of grids remained was evaluated as "U (Unsatisfactory)"; and
(III) A cured film in which less than half of grids remained was evaluated as "P (Poor)".

(ii) Stability of Cured Film in Environmental Resistance Test

If a cured film is not sufficiently imidized, stability of the cured film in an environmental test apparatus is decreased. In view of this, the stability, of the cured film thus prepared, in the environmental test apparatus was measured. With the use of a thermo-hygrostat Type: PR-1K, manufactured by ESPEC Corp., as the environmental test apparatus, evaluation was carried out such that a cured film provided on a polyimide film was subjected to an environment at 85° C./85% RH for 1000 hours, and then a condition of the cured film was observed. The evaluation was carried out as follows:

(I) A cured film in which a polyimide resin had no change was evaluated as "G (Good)";
(II) A cured film in which a polyimide resin was partially dissolved was evaluated as "U (Unsatisfactory)"; and
(III) A cured film in which a polyimide resin was completely dissolved was evaluated as "P (Poor)".

(iii) Chemical Resistance

Evaluation of chemical resistance was carried out on a surface of the cured film. The evaluation was carried out based on the following evaluation items 1 to 3 in such a manner that the polyimide film laminate was soaked and a surface of the cured film was observed.

Evaluation Item 1: A polyimide film laminate was soaked in isopropanol at 25° C. for 10 minutes, and then dried by air.

Evaluation Item 2: A polyimide film laminate was soaked in a 2N hydrochloric acid solution at 25° C. for 10 minutes. The polyimide film laminate was then washed with purified water and dried by air.

Evaluation Item 3: A polyimide film laminate was soaked in a 2N sodium hydroxide solution at 25° C. for 10 minutes. The polyimide film laminate was washed with purified water and then dried by air.

The evaluation was carried out as follows:
(I) A cured film in which a polyimide resin had no change was evaluated as "G (Good)";
(II) A cured film in which a polyimide resin was partially dissolved was evaluated as "U (Unsatisfactory)"; and
(III) A cured film in which a polyimide resin was completely dissolved was evaluated as "P (Poor)".

(vi) Flexibility Evaluation

The polyimide precursor solution was applied to a surface of a polyimide film (Apical 25NPI, manufactured by Kaneka Corporation) having a thickness of 25 μm so as to have a final film thickness of 25 μm. A resultant coating film was dried at 80° C. for 20 minutes, and then 160° C. for 90 minutes. Thus, a polyimide film laminate was prepared. The polyimide film laminate was cut out into strips of 30 mm×10 mm. Each of the strips was bent in half (at a point 15 mm from its edge) by 180° for 10 times. Then, a coating film (cured film) of each of the strips was observed with eyes to examine whether or not a crack occurred. The evaluation was carried out based on definition as follows:
(I) "G (Good)" indicates a cured film having no crack;
(II) "U (Unsatisfactory)" indicates a cured film having a slight crack; and
(III) "P (Poor)" indicates a cured film having a crack.

(v) Wettability

Wettability of the cured film prepared in the aforementioned <Preparation of Cured Film on Polyimide Film> was measured in accordance with a JIS K6768 measuring method.

TABLE 1

|  | Ex. 1 | Ex. 2 | Com. Ex. 1 | Com. Ex. 2 | Com. Ex. 3 | Com. Ex. 4 |
|---|---|---|---|---|---|---|
| Storage Stability | G | G | G | P | G | G |
| Adhesiveness Of Coating Film | G | G | G | G | G | G |
| Stability of Film in Environmental Resistance Test | G | G | P | G | P | P |
| Chemical Resistance Evaluation Item 1 | G | G | G | G | G | G |
| Evaluation Item 2 | G | G | G | G | G | G |
| Evaluation Item 3 | G | G | P | G | P | G |
| Flexibility Evaluation | G | G | G | G | G | G |
| Wettability (mN/m) | 38 | 38 | 36 | 36 | 38 | 30 or less |

Abbreviation:
Ex. stands for Example;
Com. Ex. stands for Comparative Example;
G stands for Good; and
P stands for Poor.

Synthesis Example 2

Synthesis of Partially Imidized Polyimide Precursor Having Urethane Bond

Into a separable flask under nitrogen pressure, there was added methyl triglyme (=1,2-bis(2-methoxyethoxy)ethane) (66.5 g) as a solvent for polymerization. Then, 10.3 g (0.050 mol) of norbornene diisocyanate was added therein and heated to 80° C. so that the norbornene diisocyanate was dissolved in the solvent. Into a resultant solution was added, over 1 hour, a solution in which 50.0 g (0.025 mol) of polycarbonate diol (trade name PCDL T5652, manufactured by Asahi Kasei Co., Ltd.: a polycarbonate diol having an average molecular weight of 2000, represented by General Formula (16):

[Chem. 25]

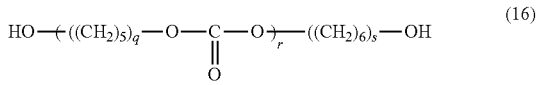

wherein q, r, and s are an integer of not less than 1) was dissolved in methyl triglyme (50.0 g).

A resultant solution was stirred by heating at 80° C. for 5 hours. After a reaction was completed, 31.02 g (0.100 mol) of 3,3',4,4'-oxydiphthalic acid dianhydride (hereinafter referred to as ODPA) and methyl triglyme (52.0 g) were added to an obtained reactant solution. After these compounds were added, the reactant solution was heated to 200° C. for 3 hours to carry out a reaction. In this way, a solution of a urethane imide oligomer having a terminal acid anhydride was prepared. After the reaction was completed, the reactant solution was cooled down with ice to about 5° C.

Into the reactant solution, 21.92 g (0.075 mol) of 1,3-bis (3-aminophenoxy)benzene was added and stirred for 4 hours at 5° C., thereby preparing a partially imidized polyimide precursor, of the present invention, having a urethane bond (a weight-average molecular weight thereof was 90,000, and a number-average molecular weight thereof was 35,000). The solution had a solute concentration of 40% and a viscosity of 800 poise at 23° C.

Example 2

In order to examine storage stability of the polyimide precursor composition solution obtained in Synthesis Example 2, the polyimide precursor composition solution was evaluated in the same manner as in Example 1. An evaluation result thereof is shown in Table 1. Further, a cured film obtained from the polyimide precursor obtained in Synthesis Example 2 was evaluated in the same manner as in Example 1. Evaluation results thereof are shown in Table 1.

Comparative Example 1

In a well dried 3-necked flask equipped with a stirrer, 22 mmol (7.045 g) of 2,2'-bis(trifluoromethyl)benzidine was dissolved in 28 mL of m-cresol containing 1 mL of γ-picoline at 60° C. Into a resultant mixture, 10 mmol (1.961 g) of a 1,2,3,4-cyclobutane tetracarboxylic acid dianhydride powder, which had been dried in vacuum at 120° C. for 12 hours, was gradually added over 10 to 15 minutes at 60° C. while the mixture was being stirred. A resultant reactant solution was heated to 120° C. under a nitrogen atmosphere and stirred for 1 hour, thereby preparing a uniform solution. The reactant solution was then refluxed at 190° C. for 2 hours, thereby causing a white precipitate. The reactant solution was dropped into a large amount of a diethyl ether/hexane mixed solvent so that the reactant solution was filtered to separate the precipitate. The precipitate was then dried in vacuum at 60° C. for 12 hours, thereby preparing a white powder. Subsequently, into a well dried hermetically-sealed reaction vessel equipped with a stirrer, 20 mmol (6.405 g) of 2,2'-bis (trifluoromethyl)benzidine and 10 mmol (8.005 g) of the white powder thus obtained were added, and then dissolved in 87 mL of N,N-dimethyl acetamide that had been dehydrated sufficiently with molecular sieves 4A. Then, 30 mmol (5.883 g) of a 1,2,3,4-cyclobutane-tetracarboxylic acid dianhydride powder, which had been dried in vacuum at 120° C. for 12 hours, was gradually added thereto. A resultant mixture was then stirred for 24 hours at room temperature, thereby preparing a transparent, uniform and viscous polyimide precursor solution (a weight-average molecular weight thereof was 120,000 and a number-average molecular weight thereof was 40,000). The solution thus prepared had a solute concentration of 19% and a viscosity of 600 poise at 23° C.

<Evaluation of Storage Stability of Polyimide Precursor Solution>

In order to examine storage stability of the polyimide precursor solution thus prepared, the polyimide precursor solution was evaluated in the same manner as in Example 1. An evaluation result is shown in Table 1.

Further, a cured film obtained from the polyimide precursor thus obtained was evaluated in the same manner as in Example 1. Evaluation results thereof are shown in Table 1.

As shown in Table 1, in the cured film prepared in Comparative Example 1, an imidization reaction did not proceed sufficiently by heating at 160° C. for 90 minutes. In view of this, it wad demonstrated that the cured film prepared in Comparative Example 1 had poor stability in environmental resistance test and poor alkali resistance.

Comparative Example 2

Into a 4-necked flask equipped with a dried nitrogen gas-inlet tube, a thermometer, and a stirrer, 450 g of N-methylol pyrrolidone (NMP) that had been dehydrated and purified was added and intensely stirred for 10 minutes while a nitrogen gas was flowed therein. Subsequently, 81.1 g (0.332 mol) of JEFFFAMINE D230 (average molecular weight: 243.9), manufactured by Huntsman Corporation was added thereto, and then stirred so as to obtain a uniform mixture. After that, 100.0 g (0.322 mol) of powdery 3,3',4,4'-oxydiphthalic acid dianhydride (ODPA, molecular weight of 310.2) was added thereto little by little while a reaction system was cooled down to 5° C. in an ice-water bath. Then, an obtained mixture was kept stirred for 12 hours. During the stirring, the flask was maintained at 5° C. In this way, a polyimide precursor (a weight-average molecular weight thereof was 80,000, and a number-average molecular weight thereof was 25,000) was prepared. The solution had a solute concentration of 28.5% and a viscosity of 800 poise at 23° C.

<Evaluation of Storage Stability of Polyimide Precursor Solution>

In order to examine storage stability of the polyimide precursor solution, the polyimide precursor solution was evaluated in the same manner as in Example 1. An evaluation result is shown in Table 1.

A cured film obtainable from the polyimide precursor thus prepared was evaluated in the same manner as in Example 1. Evaluation results thereof are shown in Table 1.

Comparative Example 3

Into a 5 L-separable flask equipped with a stirrer, a stirring blade, a reflux condenser, and a nitrogen gas-inlet tube, 3399.27 g of NMP, 11.89 g of water, 194.19 g of 3,3',4,4'-biphenyltetracarboxylic acid dianhydride, and 66.09 g of 4,4'-diaminodiphenylether (a mole ratio of water [water/acid component] is 1/1, a content rate of water is 0.35 weight %, a mole ratio of the acid component [acid component/diamine component] is 2/1) were added. While a nitrogen gas was flowed therein, a mixture in the flask was stirred and reacted at 50° C. for 15 hours. Then, into a resultant reactant solution, 600 g of 4,4'-diaminodiphenylether was dissolved, and then 582.55 g of 3,3',4,4'-biphenyltetracarboxylic acid dianhydride and 194.19 g of 2,3,3',4'-biphenyltetracarboxylic acid dianhydride were added and stirred at 50° C. for 20 hours so as to be reacted. Thus, a polyimide precursor (a weight-average molecular weight thereof was 20,000, and a number-average molecular weight thereof was 5,000) was prepared. The solution had a solute concentration of 30.7% and a viscosity of 370 poise at 23° C.

<Evaluation of Storage Stability of Polyimide Precursor Solution>

In order to examine storage stability of the polyimide precursor solution thus prepared, the polyimide precursor solution was evaluated in the same manner as in Example 1. An evaluation result is shown in Table 1.

Further, a cured film obtainable from the polyimide precursor thus prepared was evaluated in the same manner as in Example 1. Evaluation results are shown in Table 1.

As shown in Table 1, in the cured film obtained in Comparative Example 3, an imidization reaction did not proceed sufficiently by heating at 160° C. for 90 minutes. In view of this, it wad demonstrated that the polyimide precursor had poor stability in environmental resistance test and poor alkali resistance.

Comparative Example 4

Into a 500-ml glass flask, 48.5 g (165.0 mmol) of 2,3,3',4'-biphenyltetracarboxylic acid dianhydride and 80 g of methyl triglyme (TG) were added and stirred by heating at 180° C. under a nitrogen atmosphere. After that, 117.3 g (127.5 mmol) of α, ω-bis(3-aminopropyl)polydimethylsiloxane (DAPSi, amino equivalent of 460, n=10) and 40 g of TG were added thereto, and stirred by heating at 180° C. for 60 minutes. Into a resultant reactant solution, 6.4 g (22.5 mmol) of bis(3-carboxy, 4-aminophenyl)methane and 20 g of TG were added and stirred by heating at 180° C. for 6 hours. Subsequently, a resultant reactant solution was cooled down to 60° C., and 1.0 g (31.5 mmol) of methanol was added to the reactant solution. The reactant solution was stirred by heating for 2 hours while being refluxed, so that the reactant solution was half-esterified. The reactant solution thus half-esterified was filtered so as to obtain a half-esterified imide siloxane oligomer (a weight-average molecular weight thereof was 6,000, and a number-average molecular weight thereof was 2,000). The solution had a solute concentration of 51% and a viscosity of 50 poise at 23° C.

<Evaluation of Storage Stability of Polyimide Solution>

In order to examine storage stability of the polyimide solution thus prepared, the polyimide solution was evaluated in the same manner as in Example 1. An evaluation result thereof was shown in Table 1.

Further, a cured film obtainable from the polyimide thus prepared was evaluated in the same manner as in Example 1. Evaluation results thereof are shown in Table 1.

Examples 3 to 5

Preparation of Photosensitive Resin Composition

The (A) partially imidized polyimide precursor having a urethane bond, obtained in Synthesis Example 1 or 2, a (B)

photosensitive resin, a (C) photopolymerization initiator, and a (D) thermosetting resin, other components, and an organic solvent were added to prepare a photosensitive resin composition. Respective amounts of constituent raw materials in terms of a resin solid content and respective types of the constituent raw materials are shown in Table 2. In Table 2, an amount of 1,2-bis(2-methoxyethoxy)ethane, which is an organic solvent, indicates a total amount of (i) the solvent used in Synthesis Example 1 or 2 and (ii) the solvent used for preparation of a photosensitive resin composition and the like. A mixed solution was completely defoamed in a defoaming device, and then subjected to the following evaluations.

TABLE 2

| Component | | Unit: Part by Weight | | |
|---|---|---|---|---|
| | | Ex. 3 | Ex. 4 | Ex. 5 |
| (A) | Synthesis Example 1 | 48.2 | — | — |
| | Synthesis Example 2 | — | 48.2 | 48.2 |
| (B) | A-9300 <1> | 4.0 | 4.0 | 4.0 |
| | BPE-1300 <2> | 10.0 | 10.0 | 10.0 |
| (C) | IRUGACURE 819 <3> | 2.0 | 2.0 | 2.0 |
| (D) | TPA-B80E <4> | 10.0 | — | — |
| | EPICLON N-665 <5> | — | — | 5.0 |
| Others | SPB-100 <6> | 20.0 | 20.0 | 20.0 |
| | AEROSIL R-974 <7> | 2.5 | 2.5 | 2.5 |
| Organic Solvent | 1,2-bis(2-methoxyethoxy)ethane | 72.3 including 2.5 g of ethyl acetate | 72.3 | 72.3 |
| | Solid Content Concentration of Photosensitive Resin Composition Solution | 57.2 | 54.5 | 54.5 |

Abbreviation: Ex. stands for Example.
<1> Trade name NK ester A-9300 (ethoxylated isocyanuric acid triacrylate), manufactured by Nakamura Chemical Co., Ltd.
<2> Trade name NK ester BPE-1300 (bisphenol A EO-denatured diacrylate, molecular weight: 1684), manufactured by Nakamura Chemical Co., Ltd
<3> Product manufactured by CIBA specialty chemicals Inc.: Photopolymerization initiator
<4> Trade name DURANATE TPA-B80E (block isocyanate; a solid content concentration of 80%, ethyl acetate solution), manufactured by Asahi Kasei Chemicals Corporation
<5> Product manufactured by Dainippon Ink and Chemicals Inc.: Cresol novolac type polyfunctional epoxy resin
<6> Trade name SPB-100 (phosphazene compound), manufactured by Otsuka Chemical Co., Ltd.
<7> Product manufactured by Nippon Aerosil Co., Ltd.: Silica particles <Preparation of Coating Film on Polyimide Film>

With the use of a Baker's applicator, each of the photosensitive resin compositions thus prepared was flow-cast and applied to a polyimide film, (manufactured by Kaneka Corporation: trade name 75NPI) having a thickness of 75 μm in an area of 100 mm×100 mm so as to have a final dried film thickness of 25 μm, and dried 80° C. for 20 minutes. A negative photomask having an area of 50 mm×50 mm with line width/space width=100 μm/100 μm was placed thereon. Resultant films were then exposed to ultraviolet rays having an integrated exposure amount of 300 mJ/cm². Then, the films were developed by spraying a 1.0 weight % sodium carbonate aqueous solution heated at 30° C., at a spraying pressure of 1.0 kgf/mm² for 60 seconds. After the development, the films were washed with purified water sufficiently, and then cured by heating in an oven at 160° C. for 90 minutes. Thus, cured films of the respective photosensitive resin compositions were prepared.

<Evaluation of Cured Film>

The cured films thus prepared were evaluated in regard to the following items. Evaluation results are shown in Table 3.

(i) Photosensitivity Evaluation

Photosensitivity of each of the photosensitive resin compositions was evaluated by observing a surface of a corresponding cured film prepared in the aforementioned item <Preparation of Coating Film on Polyimide Film>. The evaluation was based on definition as follows:

(I) "G (Good)" indicates a polyimide film in which a sensitive pattern of line width/space width=100/100 μm was clearly formed on a surface thereof, no deformation of lines caused by detachment of line portions occurred, and dissolution residues were not observed on space portions;

(II) "U (Unsatisfactory)" indicates a polyimide film in which a sensitive pattern of line width/space width=100/100 μm was clearly formed on a surface thereof, deformation of lines caused by detachment of line portions occurred, but dissolution residues were not observed on space portions; and (III) "P (Poor)" indicates a polyimide film in which a sensitive pattern of line width/space width=100/100 μm was not clearly formed on a surface thereof, line portions were detached, and dissolution residues were observed on space portions.

(ii) Adhesiveness of Cured Film

Adhesive strength of each of the cured films prepared in the aforementioned item <Preparation of Coating Film on Polyimide Film> was evaluated by a cross-cut tape method in accordance with JIS K5400 as follows:

(I) "G (Good)" indicates a cured film in which no detachment was observed in the cross-cut tape method;

(II) "U (Unsatisfactory)" indicates a cured film in which 95% or more of grids remained; and (III) "P (Poor)" indicates a cured film in which the amount of remaining grids was less than 80%.

(iii) Solvent Resistance

Solvent resistance of each of the cured films prepared in the aforementioned item <Preparation of Coating Film on Polyimide Film> was evaluated. The evaluation was carried out in such a manner that after a cured film was immersed in methylethyl ketone at 25° C. for 15 minutes, the cured film was dried by air, and a surface of the cured film thus dried was observed. The evaluation was based on definition as follows:

(I) "G (Good)" indicates a coating film (cured film) having no problem; and (II) "P (Poor)" indicates a coating film (cured film) having a problem such as swelling or detachment.

(iv) Flexibility

In the same manner as in the item <Preparation of Coating Film on Polyimide Film>, cured-film-laminated films of the photosensitive resin compositions were formed in such a manner that a photosensitive resin composition was applied on a surface of a polyimide film (Apical 25 NPI manufactured by Kaneka Corporation) having a thickness of 25 μm. Each of the cured-film-laminated films was then cut out into strips of 30 mm×10 mm. Each of the strips was bent in half (at a point 15 mm from its edge) by 180° for 10 times. Then, a coating film (cured film) of each of the strips was observed with eyes to examine whether or not a crack occurred. The evaluation was carried out based on definition as follows:

(I) "G (Good)" indicates a cured film having no crack;

(II) "U (Unsatisfactory)" indicates a cured film having a slight crack; and (III) "P (Poor)" indicates a cured film having a crack.

(v) Insulation Reliability

On a flexible copper-clad laminate (the thickness of a copper foil is 12 μm, a polyimide film is Apical 25 NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, washed with purified water, and subjected to a surface treatment of the copper foil. After that, in the same manner as in <Preparation of Coating Film on Polyimide Film>, a cured film of a photosensitive resin composition was formed on the comb-shaped pattern, so as to prepare a test piece. The test piece was set in an environmental test apparatus at 85° C. and 85% RH, and a direct current at 100 V was applied to both ends of the test piece, so as to observe a change in insulation resistance values, an occurrence of migration, and the like. The evaluation was carried out based on definition as follows:

(I) "G (Good)" indicates one in which 1000 hours after the start of the test, a resistance value was not less than $10^8$, and no occurrence of migration, formation of dendrites, or the like was observed;

(II) "P (Poor)" indicates one in which 1000 hours after the start of the test, an occurrence of migration, formation of dendrites, or the like was observed.

(vi) Wettability

Wettability of each of the cured films prepared in the aforementioned item <Preparation of Coating Film on Polyimide Film> was measured in accordance with JIS K6768.

(vii) Solder Heat Resistance

In the same manner as in the aforementioned item <Preparation of Coating Film on Polyimide Film>, a cured-film-laminated film of each of the photosensitive resin compositions was prepared in such a manner that a photosensitive resin composition was applied on a surface of a polyimide film (manufactured by Kaneka Corporation, APICAL 75NPI) having a thickness of 75 µm.

A resultant coated film was floated on a solder bath that was completely melted at 260° C., so that a surface of the resultant coated film on which surface a cured film of the photosensitive resin composition was formed made contact with the solder bath. Ten seconds later, the coated film was pulled up. This operation was repeated 3 times, and the adhesive strength of the cured film was evaluated by a cross-cut tape method in accordance with JIS K5400 as follows:

(I) "G (Good)" indicates a cured film in which no detachment was observed in the cross-cut tape method;

(II) "U (Unsatisfactory)" indicates a cured film in which 95% or more of grids remained; and (III) "P (Poor)" indicates a cured film in which the amount of remaining grids was less than 80%.

(viii) Warpage

In the same manner as in the aforementioned item <Preparation of Coating Film on Polyimide Film>, a cured-film-laminated film of each of the photosensitive resin compositions was prepared in such a manner that a photosensitive resin composition was applied on a surface of a polyimide film (manufactured by Kaneka Corporation, APICAL 25NPI) having a thickness of 25 µm.

The cured film was cut out into a film having an area of 50 mm×50 mm, and the film was placed on a flat and smooth table so that a coating film (cured film) thereof turned up. Then, how much an end portion of the film was warped was measured. FIG. 1 is a schematic view illustrating which portion in the film is to be measured. As the amount of warpage on a surface of the polyimide film is less, stress exerted on a surface on a printed wiring board becomes small. This results in that the amount of warpage of the printed wiring board is also decreased. In view of this, it is preferable that the amount of warpage be not more than 5 mm.

(ix) Flame Resistance

A flame resistance test was carried out as follows, in accordance with the UL94 standard for a flame resistance test of plastic material. In the same manner as in the aforementioned item <Preparation of Coating Film on Polyimide Film>, a cured-film-laminated film of each of the photosensitive resin compositions was prepared in such a manner that a photosensitive resin composition was applied on both surfaces of a polyimide film (manufactured by Kaneka Corporation, APICAL 25NPI) having a thickness of 25 µm. A prepared sample was cut out into a shape of 50 mm in width, 200 mm in length, and 75 µm in thickness (including the thickness of the polyimide film). Then, a marked line was formed on the sample at a point 125 mm from its edge and the sample was rolled into a cylinder having a diameter of about 13 mm. A PI tape was attached to the sample so that no gap was formed in an overlapping portion, of the sample, above the marked line (i.e., a 75-mm-long portion of the sample) and in an upper portion of the sample. In this way, 20 sample tubes for the flame resistance test were prepared. Among them, 10 sample tubes were subjected to a treatment under a condition (1) (23° C./50% relative humidity/48 hours), while remaining 10 tubes were subjected to a treatment under a condition (2) (70° C., 168 hours) and cooled down in a desiccator filled with anhydrous calcium chloride for at least 4 hours. These samples were fixed upright by clamping their upper portions. Then, a burner was turned on and put closer to bottom portions of the samples for 10 seconds to ignite them. After 10 seconds passed, the burner was drawn from the samples, and it was measured how long it took for a flame or burning of each of the samples to be extinguished or to stop. Evaluation of the frame resistance was carried out based on definition as follows:

(I) If, under each condition ((1), (2)), samples automatically stopped burning and flames thereof were automatically extinguished within at least 5 seconds but at most 10 seconds on average (of 10 samples) after the burner was drawn away from the samples, a photosensitive resin composition thereof was evaluated as "G (Good)"; and (II) If there was even one sample which did not stop burning within 10 seconds or which burned with a flame reaching a clamp of an upper portion of the sample, a photosensitive resin composition thereof was evaluated as "P (Poor)".

TABLE 3

| Evaluation Item | Ex. 3 | Ex. 4 | Ex. 5 | Com. Ex. 5 | Com. Ex. 6 |
|---|---|---|---|---|---|
| Photosensitivity | G | G | G | G | G |
| Adhesiveness | G | G | G | G | G |
| Solvent Resistance | G | G | G | G | P |
| Flexibility | G | G | G | U | G |
| Insulation Reliability | G | G | G | G | P |
| Wettability (mN/m) | 38 | 38 | 36 | 38 | 30 or less |
| Solder Heat Resistance | G | G | G | G | G |
| Warpage (mm) | 0.0 | 0.5 | 0.0 | 15 | 3.0 |
| Flame Resistance | G | G | G | P | G |

Abbreviation:
Ex. stands for Example;
Com. Ex. stands for Comparative Example;
G stands for Good;
U stands for Unsatisfactory; and
P stands for Poor.

Comparative Example 5

In a reaction vessel (equipped with a stirrer, a reflux condenser, and a nitrogen-inlet tube) under a nitrogen atmosphere, 67.16 g (0.1825 mol) of 4,4'-bis(3-aminophenoxy) biphenyl was dissolved in 135 g of N,N-dimethyl acetamide and 135 g of diethylene glycol dimethyl ether. While this mixture was being stirred, 53.214 g (0.1810 mol) of 3,3'-4,4'-biphenyltetracarboxylic acid dianhydride in a dry solid form was added thereto little by little. During the addition of the compound, the reaction vessel was maintained at 25° C. to 30° C. After the addition was completed, a resultant mixture was kept stirred for 20 hours under a nitrogen atmosphere, thereby preparing a polyamide acid having a solid content of 30%.

Subsequently, 200 g of the polyamide acid solution, 24 g of pentaerythritol triacrylate (ARONIX M-305 manufactured by Toagosei Co., Ltd), 6 g of polyethylene glycol 200 diacrylate (NKA-200 manufactured by Shin-Nakamura Chemical Co., Ltd.), 4 g of IRUGACURE 907 (hereinafter just referred to as IGC 907, manufactured by Ciba-Geigy K.K.), and 1 g of KAYACURE DETX (hereinafter just referred to as DETX, manufactured by Nippon Kayaku Co., Ltd.) were mixed. A resultant mixed solution was completely defoamed in a defoaming device. An obtained composition was evaluated in the same manner as in Example 3 by measuring values of its physical properties. Evaluation results are shown in Table 3.

Comparative Example 6

A stirrer, a reflux condenser, a dropping funnel, and a nitrogen-inlet tube were attached to a 3 L-separable flask. Into the flask under a nitrogen atmosphere, 87.3 g of pyromellitic acid dianhydride (manufactured by Daicel Chemical Industries, Ltd.) and 496 g of N-methylpyrrolidone (manufactured by Wako Pure Chemical Industries, Ltd.) were poured and heated to 50° C. while being stirred. While the temperature was maintained at 50° C., 92.0 g (amine equivalent: 463) of denatured amino silicone BY16-853U (manufactured by Dow Corning Toray Silicone Company Ltd.) was dropped thereto little by little over 2 hours via the dropping funnel. After the dropping was completed, a resultant mixture was kept stirred for 1 hour at that temperature. After that, the reaction temperature was cooled down to 30° C. or less, and 87.7 g of 1,3-bis(3-aminophenoxy)benzene (manufactured by Mitsui Chemicals Inc.) was added thereto. Subsequently, the mixture was kept stirred for 20 hours under a nitrogen atmosphere, thereby preparing a polyamide acid solution having a solid content of 35% by weight.

Into the solution, 88.5 g of polyethylene glycol denatured bisphenol A dimethacrylate (FA321M manufactured by Hitachi Chemical Co., Ltd), 53.4 g of pentaerythritol triacrylate (M305: Toagosei Co., Ltd), 10.7 g of 2,4,6-trimethylbenzoyl diphenyl phosphine oxide (SPEEDCURE TPO, manufactured by Nihon Siber Hegner K.K.), which was a photoinitiator, and 50.4 g of bisphenol A bis(diphenyl)phosphate (CR-741, manufactured by Daihachi Chemical Industry Co., Ltd.), which was a flame retardant, were added at room temperature and stirred for 5 hours, thereby preparing a brownish viscous liquid. The solution had a viscosity of 15 Pa·s.

The mixed solution thus prepared was completely defoamed in a defoaming device. A resultant composition was evaluated in the same manner as in Example 3 by measuring values of its physical properties. Evaluation results are shown in Table 3.

Examples 6 to 8

Preparation of Thermosetting Resin Composition

The (A) partially imidized polyimide precursor having a urethane bond, obtained in Synthesis Example 1 or 2, a (D) thermosetting resin, other components, and an organic solvent were added to prepare a thermosetting resin composition. Respective amounts of constituent raw materials in terms of a resin solid content and respective types of the constituent raw materials are shown in Table 4. In Table 4, an amount of 1,2-bis(2-methoxyethoxy)ethane, which is an organic solvent, indicates a total amount of (i) the solvent used in Synthesis Example 1 or 2 and (ii) the solvent used for preparation of a thermosetting resin composition and the like. A mixed solution was completely defoamed in a defoaming device, and then subjected to the following evaluations.

TABLE 4

| | | | | | Unit: Part by Weight | |
| Component | | Ex. 6 | Ex. 7 | Ex. 8 | Com. Ex. 7 | Com. Ex. 5 |
| --- | --- | --- | --- | --- | --- | --- |
| (A) | Synthesis Example 1 | 48.2 | — | — | — | — |
| | Synthesis Example 2 | — | 48.2 | 48.2 | — | — |
| Polyimide Precursor | Comparative Example 1 | — | — | — | 48.2 | — |
| | Comparative Example 2 | — | — | — | — | 48.2 |
| (D) | TPA-B80E <8> | 10.0 | 10.0 | — | — | — |
| | EPICLON N-665 <9> | — | — | 5.0 | 5.0 | 5.0 |
| Others | SPB-100 <10> | 10.0 | 10.0 | 10.0 | 10.0 | 10.0 |
| | AEROSIL R-974 <11> | 2.0 | 2.0 | 2.0 | 2.0 | 2.0 |
| Organic Solvent | 1,2-bis(2-methoxyethoxy)ethane | 46.8 including 2.5 g of ethyl acetate | 46.8 including 2.5 g of ethyl acetate | 43.5 | — | — |
| | N,N-dimethylacetamide | — | — | — | 205.5 | — |
| | N-methyl-2-pyrrolidone | — | — | — | — | 169.1 |
| | Solid Content Concentration of Thermosetting Resin Composition Solution | 60.0 | 60.0 | 60.0 | 24.1 | 27.8 |

Abbreviation:
Ex. stands for Example; and
Com. Ex. stands for Comparative Example.
<8> Trade name DURANATE TPA-B80E (block isocyanate; a solid content concentration of 80%, ethyl acetate solution), manufactured by Asahi Kasei Chemicals Corporation
<9> Product manufactured by Dainippon Ink and Chemicals Inc.: Cresol novolac type polyfunctional epoxy resin
<10> Trade name SPB-100 (phosphazene compound), manufactured by Otsuka Chemical Co., Ltd.
<11> Product manufactured by Nippon Aerosil Co., Ltd.: Silica particles.

<Preparation of Coating Film on Polyimide Film>

With the use of a Baker's applicator, each of the thermosetting resin compositions thus prepared was flow-cast and applied to a polyimide film (manufactured by Kaneka Corporation: trade name 75NPI) having a thickness of 75 μm in an area of 100 mm×100 mm so that a final dried film had a thickness of 25 μm. Resultant coating films were dried at 80°

C. for 20 minutes and then cured by heating in an oven at 160° C. for 90 minutes, thereby preparing cured films of the respective thermosetting resin compositions.

<Evaluation of Cured Film>

The cured films thus prepared were evaluated in terms of the following items. Evaluation results thereof are shown in Table 5.

(ii) Adhesiveness of Cured Film

Adhesive strength of each of the cured films thus prepared in the aforementioned item <Preparation of Coating Film on Polyimide Film> was evaluated by a cross-cut tape method in accordance with JIS K5400, as follows:

(I) "G (Good)" indicates a cured film in which no detachment was observed in the cross-cut tape method;
(II) "U (Unsatisfactory)" indicates a cured film in which 95% or more of grids remained; and
(III) "P (Poor)" indicates a cured film in which the amount of remaining grids was less than 80%.

(iii) Solvent Resistance

Solvent resistance of each of the cured films prepared in the aforementioned item <Preparation of Coating Film on Polyimide Film> was evaluated. The evaluation was carried out in such a manner that after a cured film was immersed in methylethyl ketone at 25° C. for 15 minutes, the cured film was dried by air, and a surface of the cured film thus dried was observed. The evaluation was based on definition as follows:

(I) "G (Good)" indicates a coating film (cured film) having no problem; and
(II) "P (Poor)" indicates a coating film (cured film) having a problem such as swelling or detachment.

(iv) Flexibility

In the same manner as in the item <Preparation of Coating Film on Polyimide Film>, cured-film-laminated films of the thermosetting resin compositions were formed in such a manner that a thermosetting resin composition was applied on a surface of a polyimide film (Apical 25 NPI manufactured by Kaneka Corporation) having a thickness of 25 μm. Each of the cured-film-laminated films was then cut out into strips of 30 mm×10 mm. Each of the strips was bent in half (at a point 15 mm from its edge) by 180° for 10 times. Then, a coating film (cured film) of each of the strips was observed with eyes to examine whether or not a crack occurred. The evaluation was carried out based on definition as follows:

(I) "G (Good)" indicates a cured film having no crack;
(II) "U (Unsatisfactory)" indicates a cured film having a slight crack; and
(III) "P (Poor)" indicates a cured film having a crack.

(v) Insulation Reliability

On a flexible copper-clad laminate (the thickness of a copper foil is 12 μm, a polyimide film is Apical 25 NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, washed with purified water, and subjected to a surface treatment of the copper foil. After that, in the same manner as in <Preparation of Coating Film on Polyimide Film>, a cured film of a thermosetting resin composition was formed on the comb-shaped pattern, so as to prepare a test piece. The test piece was set in an environmental test apparatus at 85° C. and 85% RH, and a direct current at 100 V was applied to both ends of the test piece, so as to observe a change in insulation resistance values, an occurrence of migration, and the like. The evaluation was carried out based on definition as follows:

(I) "G (Good)" indicates one in which 1000 hours after the start of the test, a resistance value was not less than $10^8$, and no occurrence of migration, formation of dendrites, or the like was observed;
(II) "P (Poor)" indicates one in which 1000 hours after the start of the test, an occurrence of migration, formation of dendrites, or the like was observed.

(vi) Wettability

Wettability of each of the cured films prepared in the aforementioned item <Preparation of Coating Film on Polyimide Film> was measured in accordance with JIS K6768.

(vii) Solder Heat Resistance

In the same manner as in the aforementioned item <Preparation of Coating Film on Polyimide Film>, a cured-film-laminated film of each of the thermosetting resin compositions was prepared in such a manner that a thermosetting resin composition was applied on a surface of a polyimide film (manufactured by Kaneka Corporation, APICAL 75NPI) having a thickness of 75 μm.

A resultant coated film was floated on a solder bath that was completely melted at 260° C., so that a surface of the resultant coated film on which surface a cured film of the thermosetting resin composition was formed made contact with the solder bath. Ten seconds later, the coated film was pulled up. This operation was repeated 3 times, and the adhesive strength of the cured film was evaluated by a cross-cut tape method in accordance with JIS K5400 as follows:

(I) "G (Good)" indicates a cured film in which no detachment was observed in the cross-cut tape method;
(II) "U (Unsatisfactory)" indicates a cured film in which 95% or more of grids remained; and
(III) "P (Poor)" indicates a cured film in which the amount of remaining grids was less than 80%.

(viii) Warpage

In the same manner as in the aforementioned item <Preparation of Coating Film on Polyimide Film>, a cured-film-laminated film of each of the thermosetting resin compositions was prepared in such a manner that a thermosetting resin composition was applied on a surface of a polyimide film (manufactured by Kaneka Corporation, APICAL 25NPI) having a thickness of 25 μm.

The cured film was cut out into a film having an area of 50 mm×50 mm, and the film was placed on a flat and smooth table so that a coating film (cured film) thereof turned up. Then, how much an end portion of the film was warped was measured. FIG. 1 is a schematic view illustrating which portion in the film is to be measured. As the amount of warpage on a surface of the polyimide film is less, stress exerted on a surface on a printed wiring board becomes small. This results in that the amount of warpage of the printed wiring board is also decreased. In view of this, it is preferable that the amount of warpage be not more than 5 mm.

(ix) Flame Resistance

A flame resistance test was carried out as follows, in accordance with the UL94 standard for a flame resistance test of plastic material. In the same manner as in the aforementioned item <Preparation of Coating Film on Polyimide Film>, a cured-film-laminated film of each of the thermosetting resin compositions was prepared in such a manner that a thermosetting resin composition was applied on both surfaces of a polyimide film (manufactured by Kaneka Corporation, APICAL 25NPI) having a thickness of 25 μm. A prepared sample was cut out into a shape of 50 mm in width, 200 mm in length, and 75 μm in thickness (including the thickness of the polyimide film). Then, a marked line was formed on the sample at a point 125 mm from its edge and the sample was rolled into a cylinder having a diameter of about 13 mm. A PI tape was attached to the sample so that no gap was formed in an overlapping portion, of the sample, above the marked line (i.e., a 75-mm-long portion of the sample) and in an upper portion of the sample. In this way, 20 sample tubes for the flame resistance test were prepared. Among them, 10 sample tubes were subjected to a treatment under a condition (1) (23° C./50% relative humidity/48 hours), while remaining 10 tubes were subjected to a treatment under a condition (2) (70° C., 168 hours) and then cooled down in a desiccator filled with anhydrous calcium chloride for at least 4 hours. These samples were fixed upright by clamping their upper portions. Then, a burner was turned on and put closer to bottom portions of the samples for 10 seconds to ignite them. After 10 seconds passed, the burner was drawn from the samples, and it was measured how long it took for a flame or burning of each of the samples to be extinguished or to stop. Evaluation of the frame resistance was carried out based on definition as follows:

(I) If, under each condition ((1), (2)), samples automatically stopped burning and flames thereof were automatically extinguished within at least 5 seconds but at most 10 seconds on average (of 10 samples) after the burner was drawn away from the samples, a thermosetting resin composition thereof was evaluated as "G (Good)"; and (II) If there was even one sample which did not stop burning within 10 seconds or which burned with a flame reaching a clamp of an upper portion of the sample, a thermosetting resin composition thereof was evaluated as "P (Poor)".

TABLE 5

| Evaluation Item | Ex. 6 | Ex. 7 | Ex. 8 | Com. Ex. 7 | Com. Ex. 8 |
|---|---|---|---|---|---|
| Adhesiveness | G | G | G | G | G |
| Solvent Resistance | G | G | G | G | G |
| Flexibility | G | G | G | G | G |
| Insulation Reliability | G | G | G | P | P |
| Wettability (mN/m) | 38 | 38 | 38 | 36 | 36 |
| Solder Heat Resistance | G | G | G | G | G |
| Warpage (mm) | 0.0 | 0.5 | 0.0 | 15 | 5.0 |
| Flame Resistance | G | G | G | G | G |

Abbreviation:
Ex. stands for Example;
Com. Ex. stands for Comparative Example;
G stands for Good; and
P stands for Poor.

Comparative Examples 7 to 8

The polyimide precursor obtained in Comparative Example 1 or 2, a (D) thermosetting resin, other components, and an organic solvent were added to prepare a thermosetting resin composition. Respective amounts of constituent raw materials in terms of a resin solid content and respective types of the constituent raw materials are shown in Table 4. A mixed solution was completely defoamed in a defoaming device, and then evaluated in the same manner as in Examples 6 to 8. Evaluation results thereof are shown in Table 5.

REFERENCE SIGNS LIST

1 Polyimide Film Including Photosensitive Resin Composition Thereon
2 Warpage Amount
3 Flat and Smooth Table

The invention claimed is:

1. A partially imidized polyimide precursor compound at least having a urethane bond, an imide bond, a polyamide acid structure, and a polycarbonate skeleton.

2. The polyimide precursor compound as set forth in claim 1, which is obtained by (i) reacting at least a (a) diol compound and a (b) diisocyanate compound so as to synthesize a terminal isocyanate compound, (ii) reacting the terminal isocyanate compound with a (c) tetracarboxylic acid dianhydride so as to synthesize a urethane imide oligomer having a terminal acid anhydride, and (iii) carrying out an addition reaction of the urethane imide oligomer having a terminal acid anhydride, with a (d) diamine, the (a) diol compound being represented by General Formula (1):

[Chem. 1]

(wherein R represents a divalent organic group),
the (b) diisocyanate compound being represented by General Formula (2):

[Chem. 2]

(wherein X represents a divalent organic group),
the (c) tetracarboxylic acid dianhydride being represented by General Formula (3):

[Chem. 3]

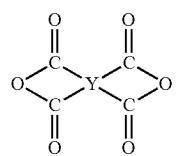

(wherein Y represents a tetravalent organic group), and
the (d) diamine being represented by General Formula (4):

[Chem. 4]

(wherein Z represents a divalent organic group).

3. The polyimide precursor compound as set forth in claim 2, wherein:
the (a) diol compound contains at least a polycarbonate diol represented by General Formula (5):

[Chem. 5]

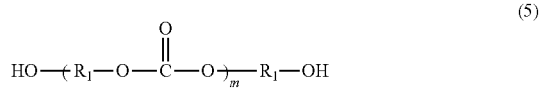

(wherein each $R_1$ independently represents a divalent organic group; and m represents an integer of 1 to 20).

4. The polyimide precursor compound as set forth in claim 1, which further has a carboxyl group in its side chain.

5. A photosensitive resin composition containing at least:
the (A) partially imidized polyimide precursor compound, as set forth in claim 1;
a (B) photosensitive resin; and
a (C) photopolymerization initiator.

6. The photosensitive resin composition as set forth in claim 5, wherein the (A) partially imidized polyimide precursor compound, the (B) photosensitive resin, and the (C) photopolymerization initiator are contained in the photosensitive resin composition such that the (B) photosensitive resin and the (C) photopolymerization initiator are contained by 10 to 200 parts by weight and by 0.1 to 50 parts by weight, respectively, relative to 100 parts by weight of a solid content of the (A) partially imidized polyimide precursor.

7. The photosensitive resin composition as set forth in claim 5, further containing a (D) thermosetting resin.

8. The photosensitive resin composition as set forth in claim 7, wherein:
the (D) thermosetting resin is contained in the photosensitive resin composition by 0.5 to 100 parts by weight relative to 100 parts by weight of a total solid content of the (A) partially imidized polyimide precursor compound, the (B) photosensitive resin, and the (C) photopolymerization initiator.

9. A thermosetting resin composition containing at least:
the (A) partially imidized polyimide precursor compound, as set forth in claim 1; and
a (D) thermosetting resin.

10. The thermosetting resin composition as set forth in claim 9, wherein:
the (D) thermosetting resin is contained in the thermosetting resin composition by 0.5 to 100 parts by weight relative to 100 parts by weight of a solid content of the (A) partially imidized polyimide precursor compound.

11. A polyimide precursor composition solution obtained by dissolving, in an organic solvent, the partially imidized polyimide precursor compound, as set forth in claim 1.

12. A resin film obtained by applying, to a surface of a base material, a polyimide precursor composition solution as set forth in claim 11, and drying the polyimide precursor composition solution thus applied.

13. An insulating film obtained by curing a resin film as set forth in claim 12.

14. A printed wiring board provided with an insulating film, wherein: the insulating film is an insulating film as set forth in claim 13; and
the printed wiring board is covered with the insulating film.

15. A polyimide precursor composition solution obtained by dissolving, in an organic solvent, a photosensitive resin composition as set forth in claim 5.

16. A resin film obtained by applying, to a surface of a base material, a polyimide precursor composition solution as set forth in claim 15, and drying the polyimide precursor composition solution thus applied.

17. An insulating film obtained by curing a resin film as set forth in claim 16.

18. A printed wiring board provided with an insulating film, wherein:
the insulating film is an insulating film as set forth in claim 17; and
the printed wiring board is covered with the insulating film.

19. A polyimide precursor composition solution obtained by dissolving, in an organic solvent, a thermosetting resin composition as set forth in claim 9.

20. A resin film obtained by applying, to a surface of a base material, a polyimide precursor composition solution as set forth in claim 19, and drying the polyimide precursor composition solution thus applied.

21. An insulating film obtained by curing a resin film as set forth in claim 20.

22. A printed wiring board provided with an insulating film, wherein:
the insulating film is an insulating film as set forth in claim 21; and
the printed wiring board is covered with the insulating film.

23. A partially imidized polyimide precursor compound, having:
(i) at least one repeating unit having a urethane bond, the repeating unit being represented by General Formula (6):

[Chem. 6]

$$\left( X-\underset{H}{N}-\underset{\underset{O}{\|}}{C}-O-R-O-\underset{\underset{O}{\|}}{C}-\underset{H}{N} \right)_m \quad (6)$$

wherein R and X each independently represent a divalent organic group; and m represents an integer of not less than 1;

(ii) imide bond represented by General Formula (7):

[Chem. 7]

$$(7)$$

wherein $R^2$ independently represents a divalent organic group; each Y independently represents a tetravalent organic group; and n represents an integer of not less than 1;

(iii) a polyamide acid structure represented by General Formula (8):

[Chem. 8]

$$(8)$$

wherein Z independently represents a divalent organic group; each Y independently represents a tetravalent organic group; and p represents an integer of not less than 1; and
(iv) a polycarbonate skeleton.

* * * * *